(12) United States Patent
Nagata

(10) Patent No.: US 6,236,349 B1
(45) Date of Patent: May 22, 2001

(54) ANALOG-DIGITAL CONVERTER ANALOG-DIGITAL CONVERTING METHOD AND VOLUME CONTROLLER SYSTEM

(75) Inventor: Mitsuru Nagata, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/236,637

(22) Filed: Jan. 26, 1999

(30) Foreign Application Priority Data

Jan. 26, 1998  (JP) .................................................. 10-013059

(51) Int. Cl.$^7$ ...................................................... H03M 1/34

(52) U.S. Cl. ........................................... 341/165; 341/163

(58) Field of Search ..................................... 341/118, 120, 341/155, 143, 144, 164, 165, 163; 348/465; 702/119

(56) References Cited

U.S. PATENT DOCUMENTS

| | | | |
|---|---|---|---|
| 3,733,600 | * 5/1973 | Hellwarth et al. | 341/129 |
| 3,995,267 | 11/1976 | Tripp . | |
| 4,504,010 | 3/1985 | Sukimoto et al. . | |
| 4,939,517 | * 7/1990 | Baltus et al. | 341/156 |
| 5,929,799 | * 7/1999 | Rothenberg | 341/118 X |

* cited by examiner

*Primary Examiner*—Patrick Wamsley
(74) *Attorney, Agent, or Firm*—Oblon, Spivak, McClelland, Maier & Neustadt, P.C.

(57) ABSTRACT

An analog-digital converter capable of outputting stable conversion codes even when an analog signal is input in the vicinity of a boundary between adjacent analog-digital conversion regions. The analog-digital converter as described is provided with ignoring regions between the conversion regions. When the signal level of the analog signal is located within one of the ignoring regions, the analog-digital conversion code outputted from the output circuit is maintained in a next period.

21 Claims, 25 Drawing Sheets

FIG.2
PRIOR ART

| CK1 | CK2 | CK3 | SW111 | SW110 | SW101 | SW100 | SW011 | SW010 | SW001 |
|---|---|---|---|---|---|---|---|---|---|
| H | H | H | ON | OFF | OFF | OFF | OFF | OFF | OFF |
| L | H | H | OFF | ON | OFF | → | → | → | → |
| H | L | H | → | OFF | OFF | OFF | → | → | → |
| L | L | H | → | → | ON | OFF | OFF | → | → |
| H | H | L | → | → | OFF | ON | OFF | → | → |
| L | H | L | → | → | → | OFF | ON | OFF | → |
| H | L | L | → | → | → | → | OFF | ON | OFF |
| L | L | L | OFF | OFF | OFF | OFF | OFF | OFF | ON |
| | | | | | | | | | OFF |

FIG.6
PRIOR ART

| INPUT | | | OUTPUT | | | | | | | |
|---|---|---|---|---|---|---|---|---|---|---|
| A | B | C | S0 | S1 | S2 | S3 | S4 | S5 | S6 | S7 |
| 0 | 0 | 0 | H | L | L | L | L | L | L | L |
| 1 | 0 | 0 | L | H | L | L | L | L | L | L |
| 0 | 1 | 0 | L | L | H | L | L | L | L | L |
| 1 | 1 | 0 | L | L | L | H | L | L | L | L |
| 0 | 0 | 1 | L | L | L | L | H | L | L | L |
| 1 | 0 | 1 | L | L | L | L | L | H | L | L |
| 0 | 1 | 1 | L | L | L | L | L | L | H | L |
| 1 | 1 | 1 | L | L | L | L | L | L | L | H |

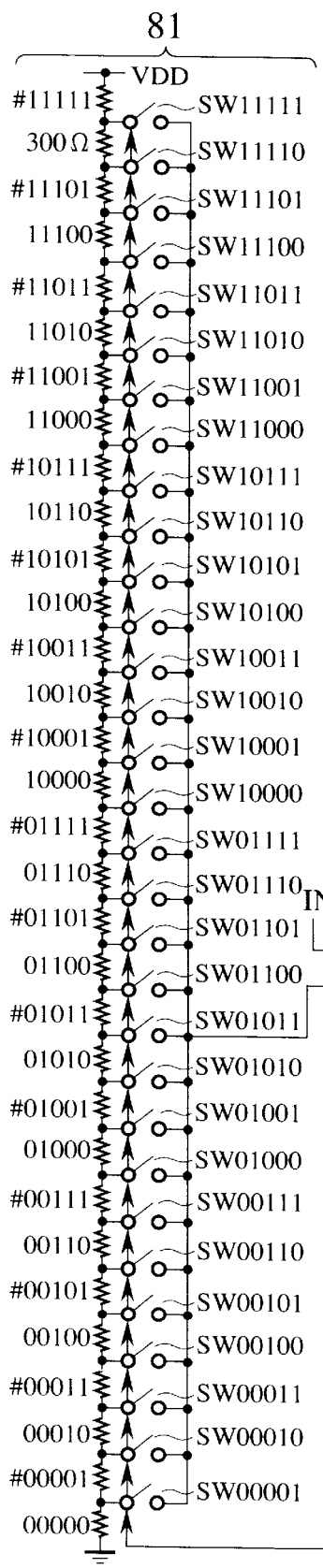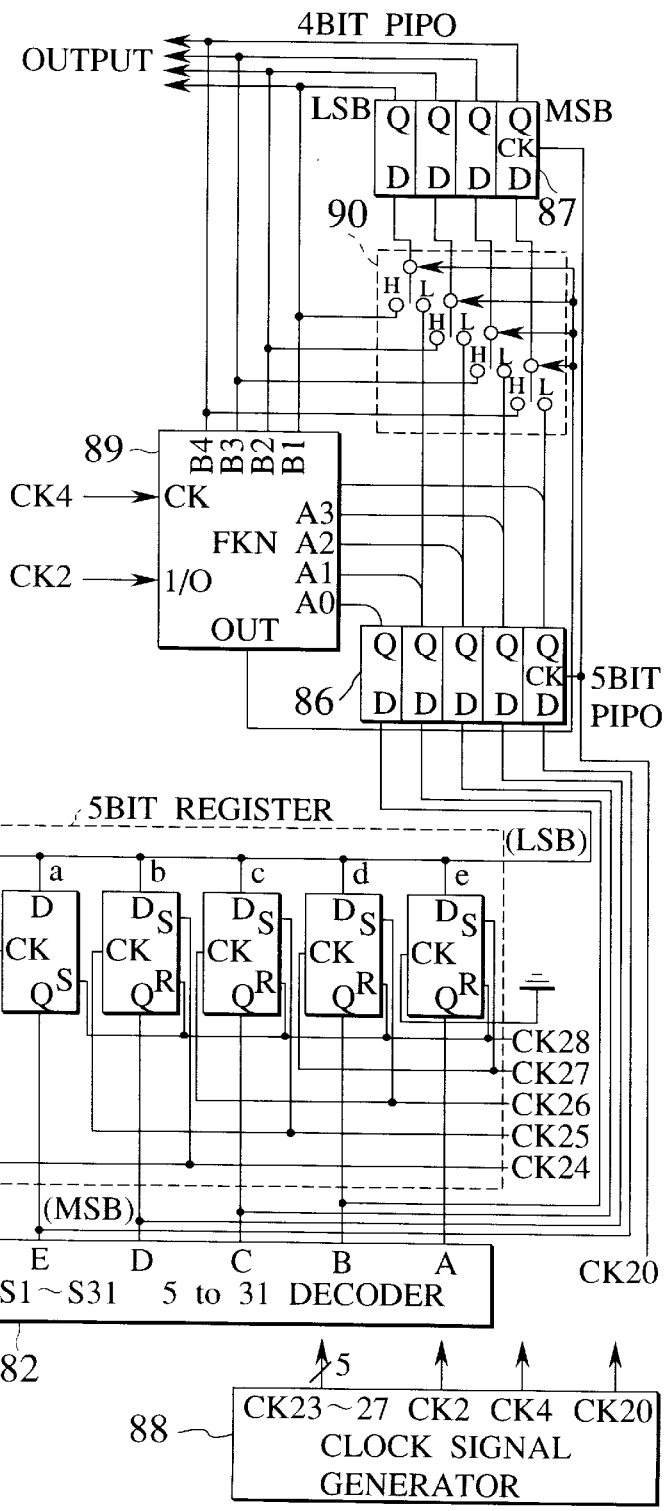
FIG.21A

TRUTH TABLE

| INPUT | | | | | SELECT | SELECT |
|---|---|---|---|---|---|---|
| A | B | C | D | E | LINE(H) | SWITCH |
| 0 | 0 | 0 | 0 | 0 | S0 | — |
| 1 | 0 | 0 | 0 | 0 | S1 | SW00001 |
| 0 | 1 | 0 | 0 | 0 | S2 | SW00010 |
| 1 | 1 | 0 | 0 | 0 | S3 | SW00011 |
| 0 | 0 | 1 | 0 | 0 | S4 | SW00100 |
| 1 | 0 | 1 | 0 | 0 | S5 | SW00101 |
| 0 | 1 | 1 | 0 | 0 | S6 | SW00110 |
| 1 | 1 | 1 | 0 | 0 | S7 | SW00111 |
| 0 | 0 | 0 | 1 | 0 | S8 | SW01000 |
| 1 | 0 | 0 | 1 | 0 | S9 | SW01001 |
| 0 | 1 | 0 | 1 | 0 | S10 | SW01010 |
| 1 | 1 | 0 | 1 | 0 | S11 | SW01011 |
| 0 | 0 | 1 | 1 | 0 | S12 | SW01100 |
| 1 | 0 | 1 | 1 | 0 | S13 | SW01101 |
| 0 | 1 | 1 | 1 | 0 | S14 | SW01110 |
| 1 | 1 | 1 | 1 | 0 | S15 | SW01111 |
| 0 | 0 | 0 | 0 | 1 | S16 | SW10000 |
| 1 | 0 | 0 | 0 | 1 | S17 | SW10001 |
| 0 | 1 | 0 | 0 | 1 | S18 | SW10010 |
| 1 | 1 | 0 | 0 | 1 | S19 | SW10011 |
| 0 | 0 | 1 | 0 | 1 | S20 | SW10100 |
| 1 | 0 | 1 | 0 | 1 | S21 | SW10101 |
| 0 | 1 | 1 | 0 | 1 | S22 | SW10110 |
| 1 | 1 | 1 | 0 | 1 | S23 | SW10111 |
| 0 | 0 | 0 | 1 | 1 | S24 | SW11000 |
| 1 | 0 | 0 | 1 | 1 | S25 | SW11001 |
| 0 | 1 | 0 | 1 | 1 | S26 | SW11010 |
| 1 | 1 | 0 | 1 | 1 | S27 | SW11011 |
| 0 | 0 | 1 | 1 | 1 | S28 | SW11100 |
| 1 | 0 | 1 | 1 | 1 | S29 | SW11101 |
| 0 | 1 | 1 | 1 | 1 | S30 | SW11110 |
| 1 | 1 | 1 | 1 | 1 | S31 | SW11111 |

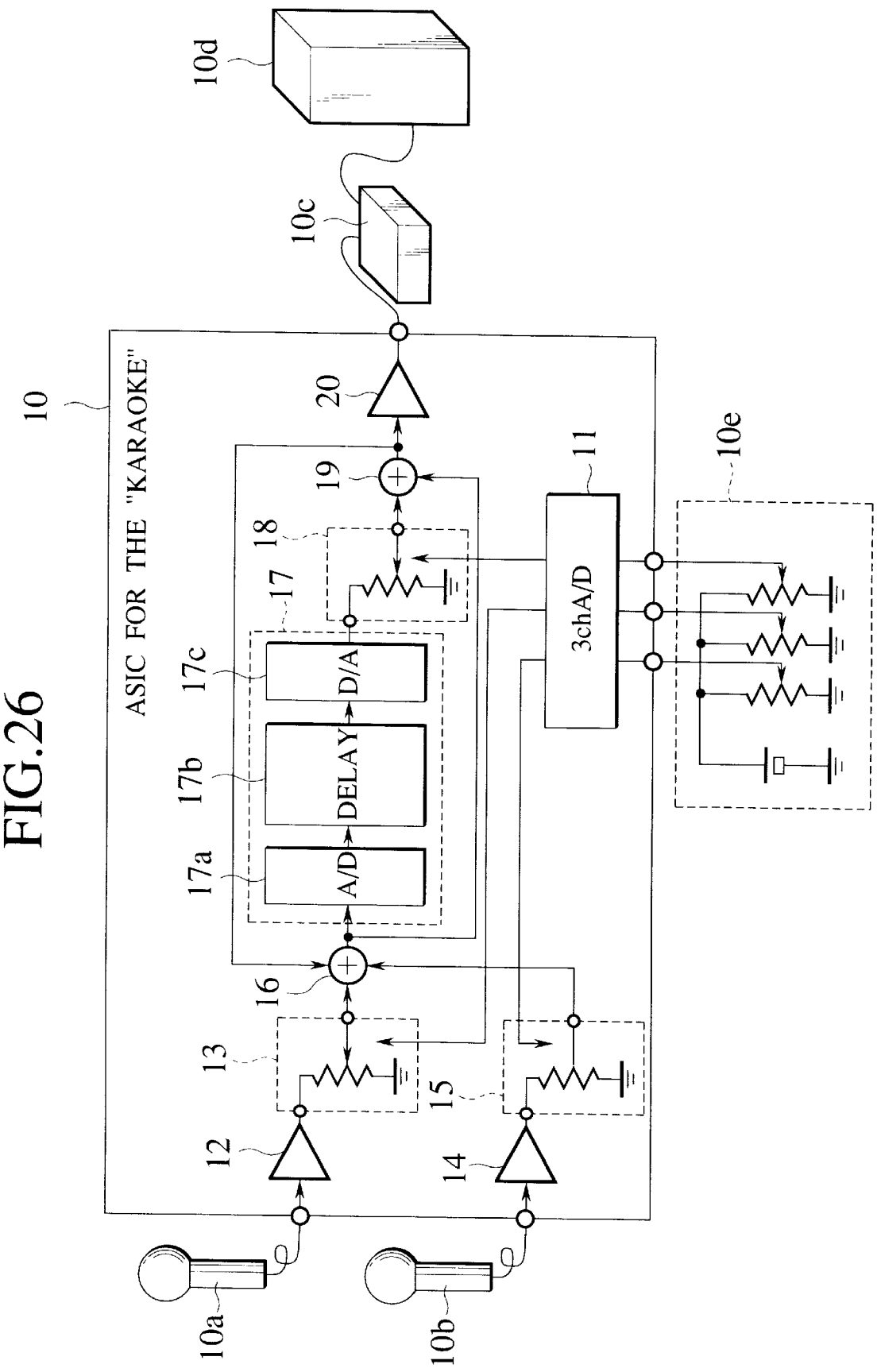

ANALOG-DIGITAL CONVERTER ANALOG-DIGITAL CONVERTING METHOD AND VOLUME CONTROLLER SYSTEM

BACKGROUND OF THE INVENTION

1. Field of the Invention

The present invention is related an analog-digital converter and an analog-digital converting method for outputting the analog-digital conversion codes without undesirable enhanced effect of noise mixed to the input analog signal, and also related to a volume controller system designed with such an analog-digital converter.

2. Prior Art

FIGS. 1(a) and 1(b) are schematic diagrams showing a prior art analog-digital converter with the resolution of 3 bits in which FIG. 1(a) is a view showing the overall configuration thereof while FIG. 1(b) is a view showing the circuit diagram of the analog switch.

The analog-digital converter is composed of a conversion level output circuit 101, a decoder (3 to 8) 102, the comparator 103, a resettable D-type flip-flop 104, the 3-bit serial-in-parallel-out (SIPO) register 105, the 3-bit parallel-in-parallel-out (PIPO) register 106 and the clock signal generator 107, as illustrated in FIG. 1(a).

The conversion level output circuit 101 is composed of a plurality of resistors connected in serial between a power source line VDD and the ground GND for generating the conversion potential levels respectively corresponding to the analog-digital conversion codes of [111] to [000], and a series of analog switches SW111 to SW001 connected to the connection points of the series of resistors.

For example, the analog switches SW001~SW111 are composed of a Pch-MOS transistor 111, an Nch-MOS transistor 112 and an inverter 113 as illustrated in FIG. 1(b), and turned on/off in accordance with the potential levels of the clock signal CK1 to CK3, as illustrated in FIG. 2, under the control of the decoder 102.

FIG. 3 is a timing chart showing the operation of the analog-digital converter.

In accordance with the operation of the analog-digital converter, one of the analog switches SW111 to SW001 is turned on in sequence, the output voltage thereof and the signal level INPUT of the analog signal as inputted are compared with each other by means of the comparator 103.

When the conversion potential level as outputted from the conversion level output circuit 101 becomes lower than the signal level INPUT of the analog signal as inputted, the comparison output level CO of the comparator 103 rises to the "H" level.

The output signal COD of the D-type flip-flops 104 rises then to the "H" level, followed by the three-bit output signal of the register 105 being [010]. The above data [010] are transferred to the register 106 in a "L" to "H" timing of the LD signal, and the analog-digital conversion code [010] is outputted as the output signal OUTPUT of the analog-digital converter.

The analog-digital converting operation is repeated followed by outputting the analog-digital conversion code [001] as the output signal OUTPUT of the analog-digital converter.

Next, a volume controller system designed with the analog-digital converter as described above will be explained in the followings.

FIG. 4 is a schematic diagram showing such a system.

The volume controller system is provided with the analog-digital converter 120 as illustrated in FIG. 1 for the purpose of controlling a digital volume controller 122 by the digitized signal converted from the DC potential outputted by the external volume controller 121. The conversion is performed by the analog-digital converter 120.

For example, the analog-digital converter 120 and the digital volume controller 122 are integrated in an audio controlling IC chip while the volume controller 121 is provided external to the IC chip.

FIG. 5 is an exemplary circuit diagram showing the digital volume controller 122. In this case, the digital volume controller 122 is an 8-level volume controller composed of the decoder (3 bits to 8 levels) and an output voltage generation circuit 122b. The relationship between the three-bit input data INPUT (A,B,C) and the three-bit output data OUTPUT is illustrated in FIG. 6. On the other hand, the output voltage generation circuit 122b is composed of a plurality of resistors "r" and a plurality of switches SW0 to SW7.

The 8-level volume controller 122 can be controlled by three-bit data, for which the analog-digital converter as illustrated in FIG. 1 can be used for implementing the volume controller system as illustrated in FIG. 4.

In the case of the volume controller system, when the input level (4V) as illustrated in FIG. 7, the analog-digital conversion code [110] is outputted from the analog-digital converter 120. The output signal S3 of the decoder 122 as illustrated in FIG. 5 becomes "H" with the switch SW3 being turned on. As a result, the signal inputted to the IN terminal is attenuated to 4/7 and outputted to the OUT terminal.

However, there are following shortcomings in the prior art analog-digital converter.

As illustrated in FIG. 7, in the case that the input level B (2.5V) is inputted as the DC potential, the analog-digital conversion code may often fluctuate between the analog-digital conversion codes [011] and [100], because the input level is between the adjacent conversion regions.

More specifically explained, as illustrated in FIG. 8(a), the signal input to the analog-digital converter 120 is necessarily mixed with noise so that, when a signal is input in the vicinity of the boundary, the analog-digital conversion code as output necessarily fluctuates in accordance with the fluctuation of the noise.

For example, when noise as mixed has a triangle wave form P11 as illustrated in FIG. 8(b), the output signal CSD(OUTPUT) of the analog-digital converter 120 periodically fluctuates between the output levels A and B ([011], [100]). As a result, when a continuous audio signal is input to the IN terminal of the digital volume controller 122, the output signal becomes modulated as treated by amplitude modulation. For this reason, the output sound sometimes becomes deteriorated and discomfortable. While the DC control signal level (the signal level of the analog signal as inputted) not frequently occurs at some of the boundaries, the greater the noise level the greater the probability of occurrence of the shortcomings because the fluctuation range is expanded with greater noise.

Accordingly, in the case of the prior art analog-digital converter, when a signal is input in the vicinity of the boundary, the analog-digital conversion code as output fluctuates due to the noise mixed to the input analog signal.

SUMMARY OF THE INVENTION

The present invention has been made in order to solve the shortcomings as described above. It is an important object of the present invention to provide an analog-digital converter and an analog-digital converting method for outputting the analog-digital conversion codes without undesirable enhanced affect of noise mixed to the input analog signal.

It is another associated object of the present invention to provide a volume controller system with such an analog-digital converting method for outputting the analog-digital conversion codes without undesirable enhanced affect of noise mixed to the input analog signal.

In brief, the above and other objects and advantages of the present invention are provided by a new and improved analog-digital converter comprising: an analog conversion level generating circuit for generating a plurality of analog conversion levels corresponding to respective codes of digitized signals; a comparator for comparing an analog signal as inputted with at least one of the analog conversion levels; and an analog-digital conversion code generating circuit for periodically outputting one of the digitized signals as an analog-digital conversion code corresponding to the analog signal as inputted. Particularly, an ignoring region is provided between adjacent analog conversion levels and, the analog-digital conversion code generating circuit outputs the analog-digital conversion code of a previous period when the analog signal as inputted is located within the ignoring region.

By this configuration, even when an analog signal is input in said vicinity of said boundary between adjacent analog-digital conversion levels, it can be avoided that said analog-digital conversion code as output fluctuates due to said noise mixed to said input signal.

Also, in accordance with a preferred embodiment of the present invention, the ignoring region has a width wider than half of a difference between adjacent analog-digital conversion levels.

By this configuration, even when significant noise appear in said analog signal with magnitudes smaller than the width of said ignoring regions, it is also not the case said analog-digital conversion code fluctuates due to said significant noise.

Also, in accordance with a preferred embodiment of the present invention, in the case that the analog signal as inputted is located within the ignoring region, the analog-digital conversion code generating circuit is operated to output the analog-digital conversion code in the previous period when the ignoring region is located adjacent to the analog conversion level corresponding to the analog-digital conversion code in the previous period while the analog-digital conversion code generating circuit is operated to output another analog-digital conversion code corresponding to one of analog conversion levels adjacent to the ignoring region when the analog signal is not located adjacent to the analog conversion level corresponding to the analog-digital conversion code in the previous period.

By this configuration, it is not the case that, when said analog signal as inputted jumps from one level to another level, which are separate ones of said ignoring regions without any intervening level, said analog-digital conversion code is maintained at said code corresponding to said previous level even after said jump.

In accordance with a further aspect of the present invention, a volume controller system comprising: a first volume controller for generating and outputting a first DC potential; the analog-digital converter as claimed in claim 1 designed for analog-digital converting the output signal of the first volume controller; and a second volume controller controlled by the conversion output signal of the analog-digital converter for generating and outputting a second DC potential.

By this configuration, it is possible to eliminate said shortcoming that said output sound sometimes becomes deteriorated and discomfortable.

In accordance with a further aspect of the present invention, a method of converting an analog signal as inputted to a digitized signal corresponding to the analog signal comprising the steps of generating a plurality of analog conversion levels corresponding to respective codes of digitized signals; comparing the analog signal as inputted to at least one of the analog conversion levels; and periodically outputting one of the digitized signals as an analog-digital conversion code corresponding to the analog signal as inputted. Particularly, an ignoring region is provided between adjacent analog conversion levels and, the analog-digital conversion code of a previous period is output when the analog signal as inputted is located within the ignoring region.

Also by this configuration, even when a signal as input is input in said vicinity of said boundary between adjacent analog-digital conversion levels, it can be avoided that said analog-digital conversion code as output fluctuates due to said noise mixed to said input signal.

Also, in accordance with a preferred embodiment of the present invention, the ignoring region has a width wider than half of a difference between adjacent analog-digital conversion levels.

By this configuration, even when a signal as input is input in said vicinity of said boundary between adjacent analog-digital conversion levels, it can be avoided that said analog-digital conversion code as output fluctuates due to said noise mixed to said input signal.

By this configuration, it is not the case that, when said analog signal as inputted jumps from one level to another level, which are separate ones of said ignoring regions without any intervening level, said analog-digital conversion code is maintained at said code corresponding to said previous level even after said jump.

Also, in accordance with a preferred embodiment of the present invention, in the case that the analog signal as inputted is located within one of the ignoring regions, the analog-digital conversion code in the previous period is output when the ignoring region is located adjacent to the analog conversion level corresponding to the analog-digital conversion code in the previous period while another analog-digital conversion code corresponding to one of analog conversion levels adjacent to the ignoring region is output when the analog signal is not located adjacent to the analog conversion level corresponding to the analog-digital conversion code in the previous period.

Also by this configuration, even when a signal as input is input in said vicinity of said boundary between adjacent analog-digital conversion levels, it can be avoided that said analog-digital conversion code as output fluctuates due to said noise mixed to said input signal.

In accordance with a further aspect of the present invention, an analog-digital converter comprising: a discrete potential generating circuit for generating a plurality of reference voltage levels; a control signal generating circuit connected to the discrete potential generating circuit for generating a control signal given to the discrete potential generating circuit in order to periodically output one of the reference voltage levels in turn; a comparator for comparing an analog signal as inputted with the reference voltage levels to output comparison result which determine a level of the analog signal as inputted respective to the reference voltage levels; and an output circuit for outputting an analog-digital conversion code of the analog signal in accordance with the comparison result of the comparator. Particularly, when the level of the analog signal as determined by the comparator corresponds to predetermined ones of the reference voltage levels, the analog-digital conversion code outputted from the output circuit is output again in a next period.

Also by this configuration, even when a signal as input is input in said vicinity of said boundary between adjacent analog-digital conversion levels, it can be avoided that said analog-digital conversion code as output fluctuates due to said noise mixed to said input signal.

Also, in accordance with a preferred embodiment of the present invention, comparison of the analog signal as inputted with the reference voltage levels is performed by a binary algorithm.

By this configuration, the number of necessary steps for obtaining the final comparison result is reduced to the order of $\log_2(n)$, while in the case of conventional analog-digital converters, the number of necessary steps is of the order of n.

Also, in accordance with a preferred embodiment of the present invention, comparison of the analog signal as inputted with the reference voltage levels is performed by repeating the steps of comparing the analog signal as inputted with intermediate one of the reference voltage levels to be compared, and narrowing the number of the reference voltage levels to be compared by excluding those of the reference voltage levels which are higher or lower than the intermediate one of the reference voltage levels.

By this configuration, the analog-digital converter operative with the binary-tree algorithm is actually implemented for comparison of said analog signal as inputted with the reference voltage levels.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 1(a) and 1(b) are schematic diagrams showing a prior art analog-digital converter with the resolution of 3 bits in which FIG. 1(a) is a view showing the overall configuration thereof while FIG. 1(b) is a view showing the circuit diagram of the analog switch.

FIG. 2 is a schematic diagram showing the operation of the analog switches, under the control of the decoder 102.

FIG. 6 is a diagram showing the relationship between the three-bit input data and the three-bit output data in the digital volume controller as illustrated in FIG. 5.

FIG. 21(a) is a circuit diagram showing the configuration of an analog-digital converter in accordance with a third embodiment of the present invention.

FIG. 26 is a block diagram showing the volume controller system provided with the analog-digital converter in accordance with the present invention as explained above and installed in a "Karaoke" sing-along system.

DETAILED DESCRIPTION OF EMBODIMENTS

Figure 9:
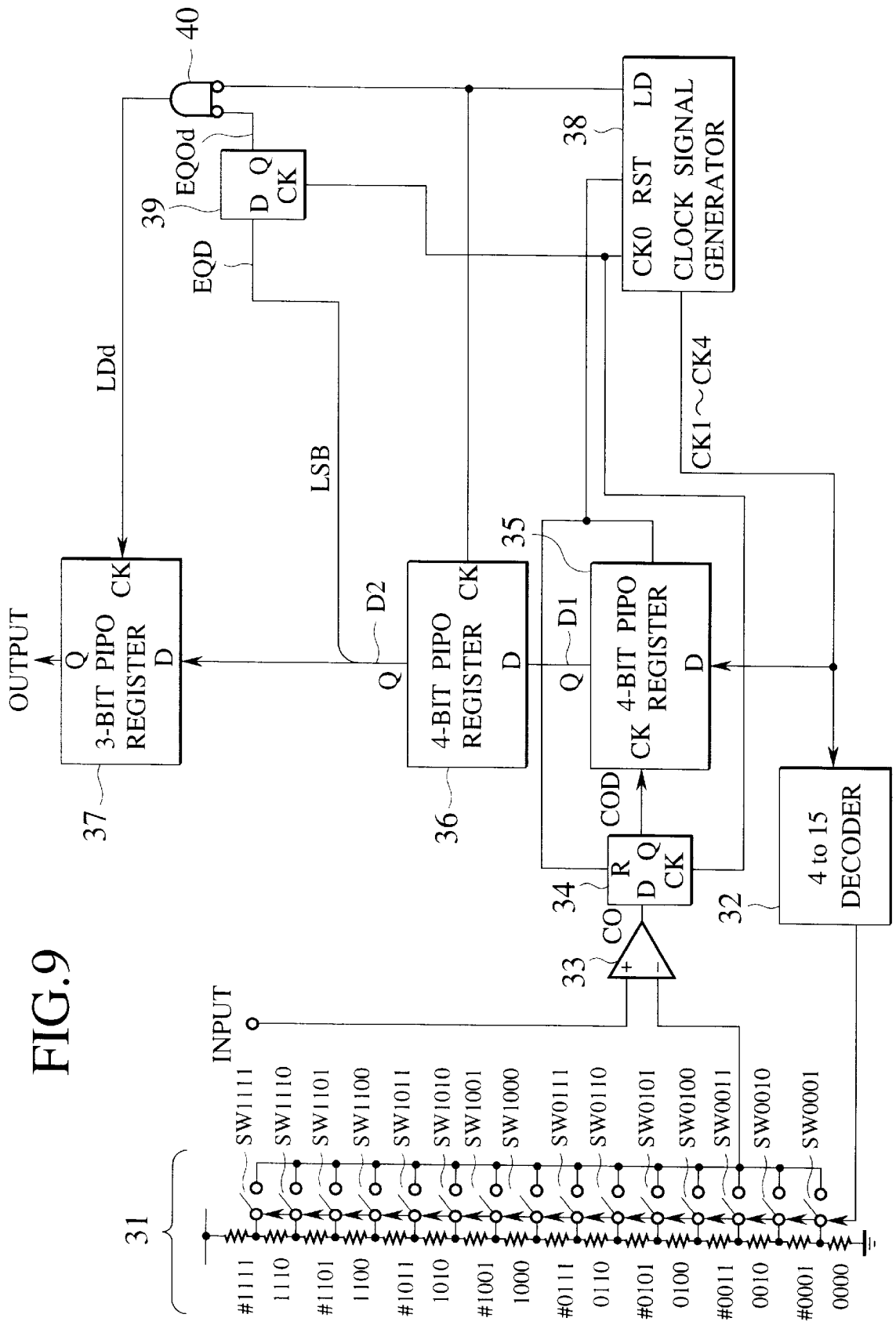
FIG. 9 is a circuit diagram showing the configuration of an analog-digital converter in accordance with a first embodiment of the present invention.

FIG. 9 is a circuit diagram showing the configuration of an analog-digital converter in accordance with a first embodiment of the present invention.

The analog-digital converter as illustrated in FIG. 9 is an analog-digital converter with the resolution of 3 bits provided with a conversion level output circuit 31. The conversion level output circuit 31 is characterized by ignoring regions which feature the present invention.

The conversion level output circuit 31 is composed of a series of resistors connected in serial between a power source line VDD and the ground GND for generating the conversion potential levels respectively corresponding to the analog-digital conversion codes, and a series of analog switches connected to the connection points of the series of the resistors. The number of the series of the resistors is double the number of resistors as used the prior art technique with double the number of the analog switches. Namely, the conversion level output circuit 31 is designed in the form of a 4-bit analog-digital converter.

Accordingly, the conversion level output circuit 31 is provided with resistors to output the conversion potential levels corresponding to the analog-digital conversion codes of [1110], [1100], [1010], [1000], [0110], [0100], [0010] and [0000] as well as intermediate levels between adjacent conversion potential levels forming ignoring regions. The intermediate levels are corresponding to the analog-digital conversion codes of [1111], [1101], [1011], [1001], [0111], [0101], [0011] and [0001] which are distinguished by making with "#" in the figure. Also, there are provided with a number of analog switches SW1111 to SW0001 corresponding to the series of the resistors.

Figure 1A:
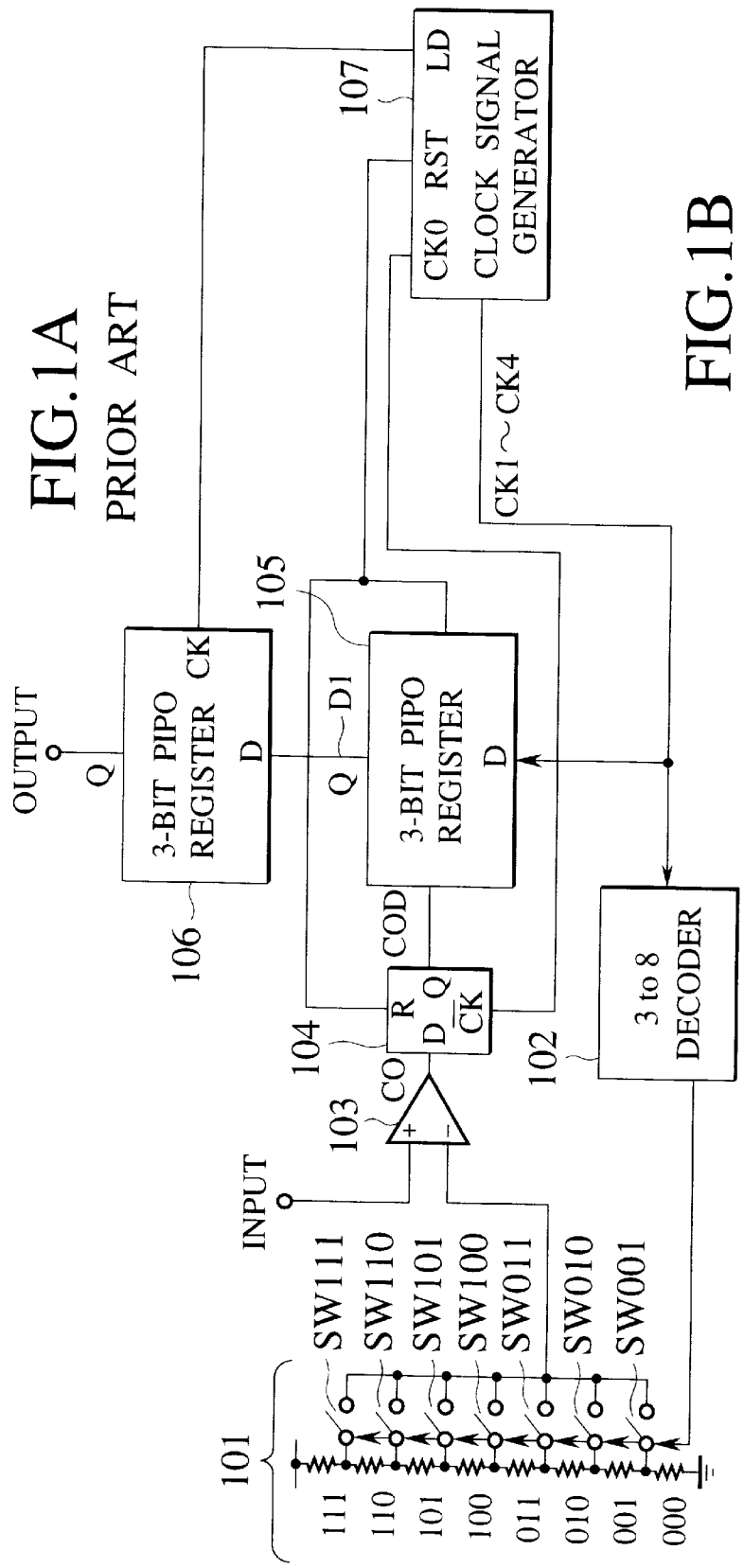
Figure 1B:
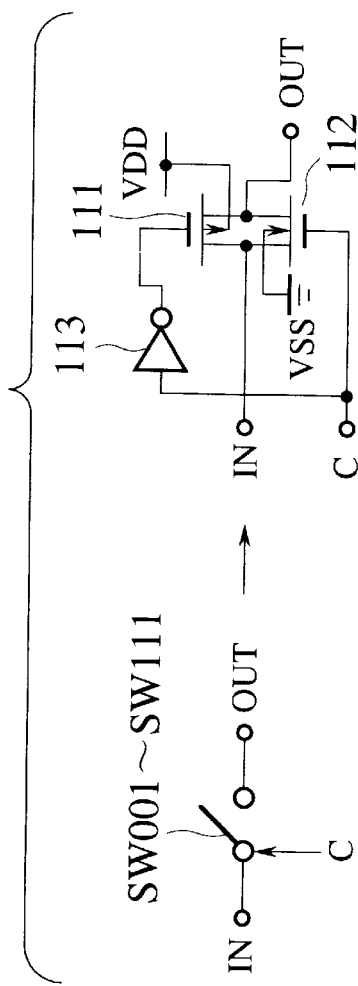
Figure 3:
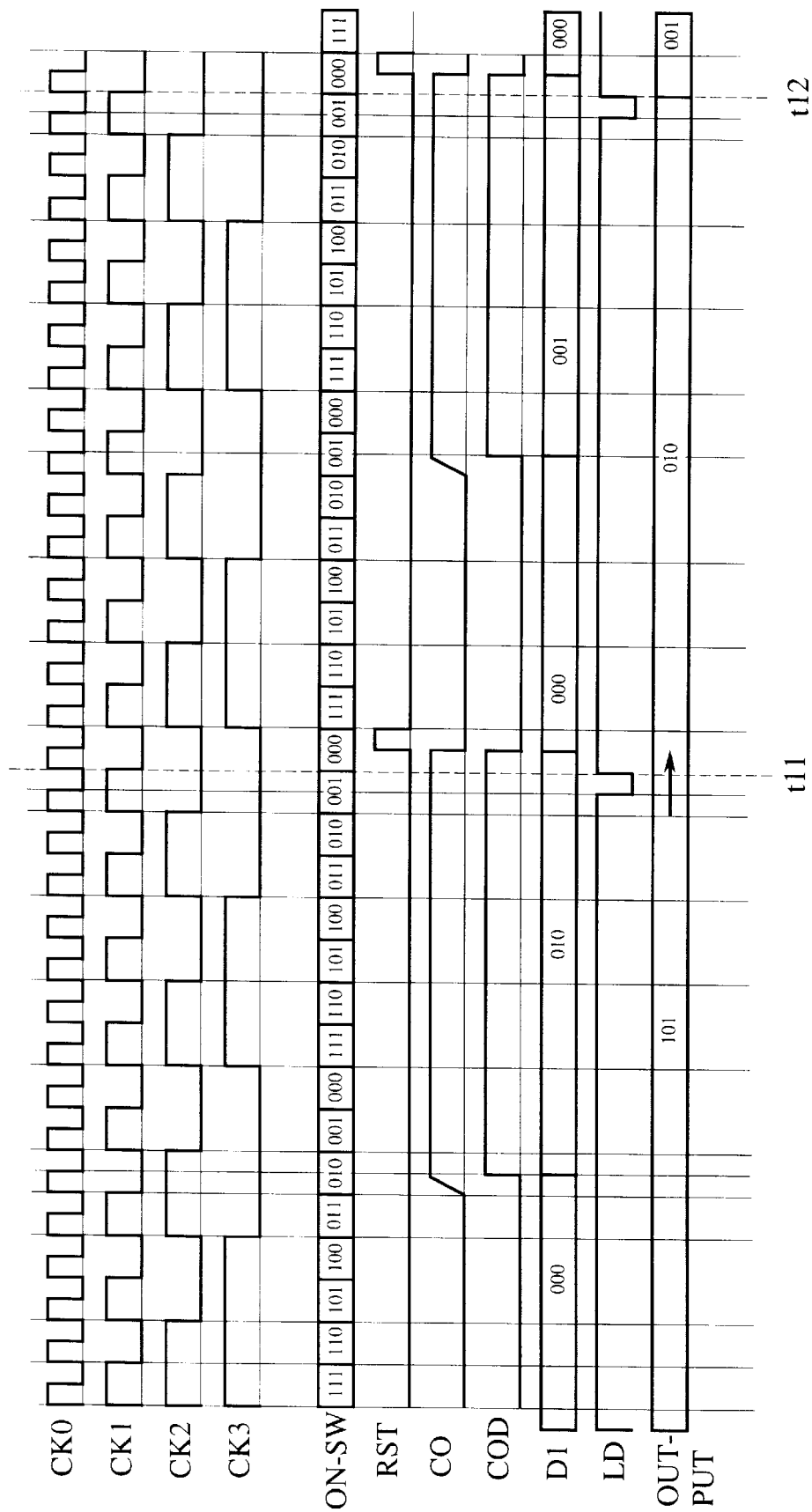
FIG. 3 is a timing chart showing the operation of the conventional analog-digital converter.
Figure 4:
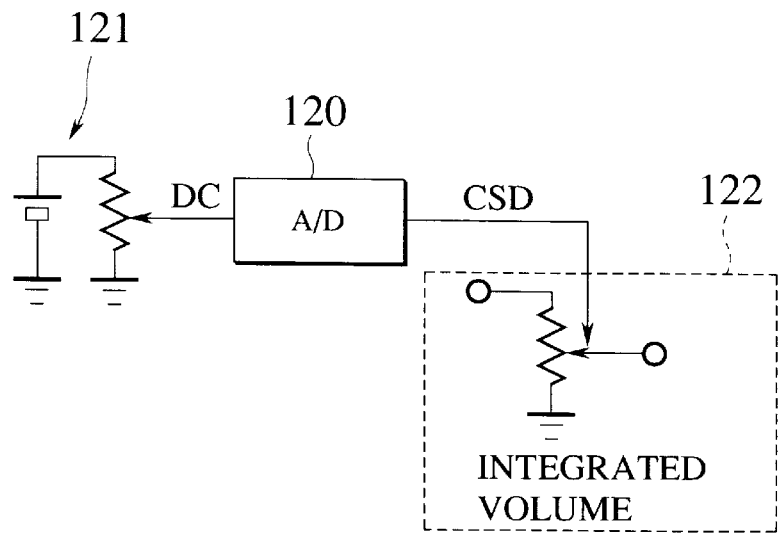
FIG. 4 is a schematic diagram showing such a conventional system.
Figure 5:
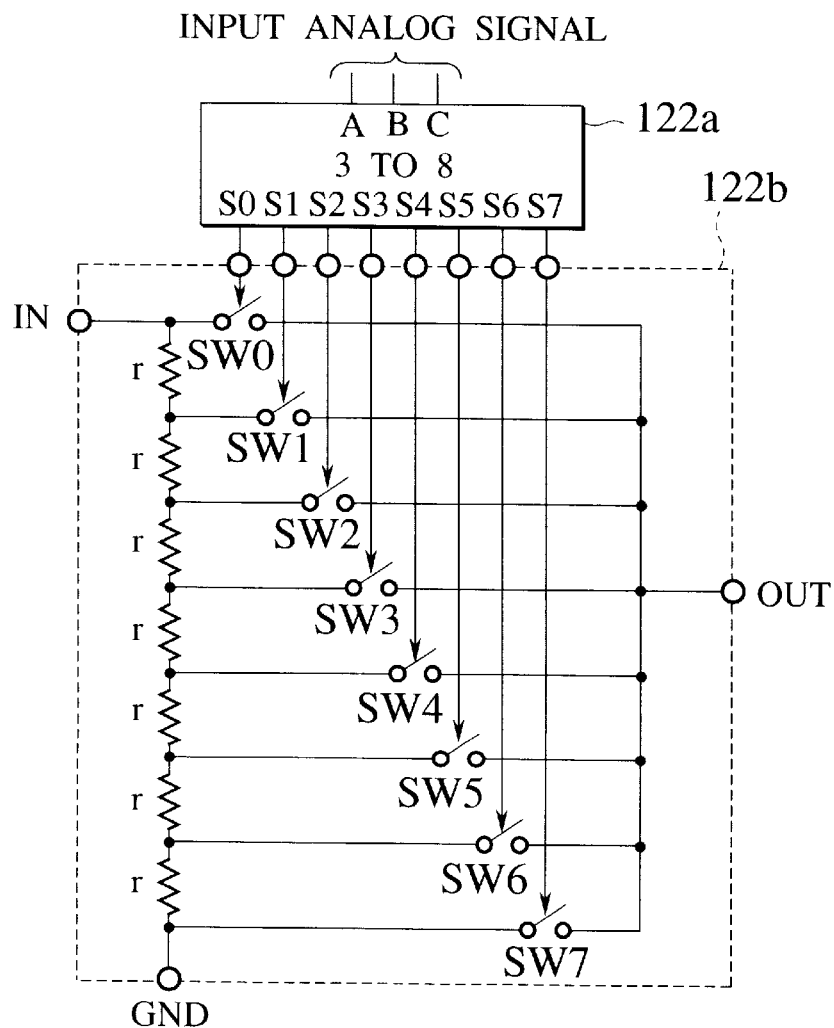
FIG. 5 is an exemplary circuit diagram showing the digital volume controller 122.
Figure 7:
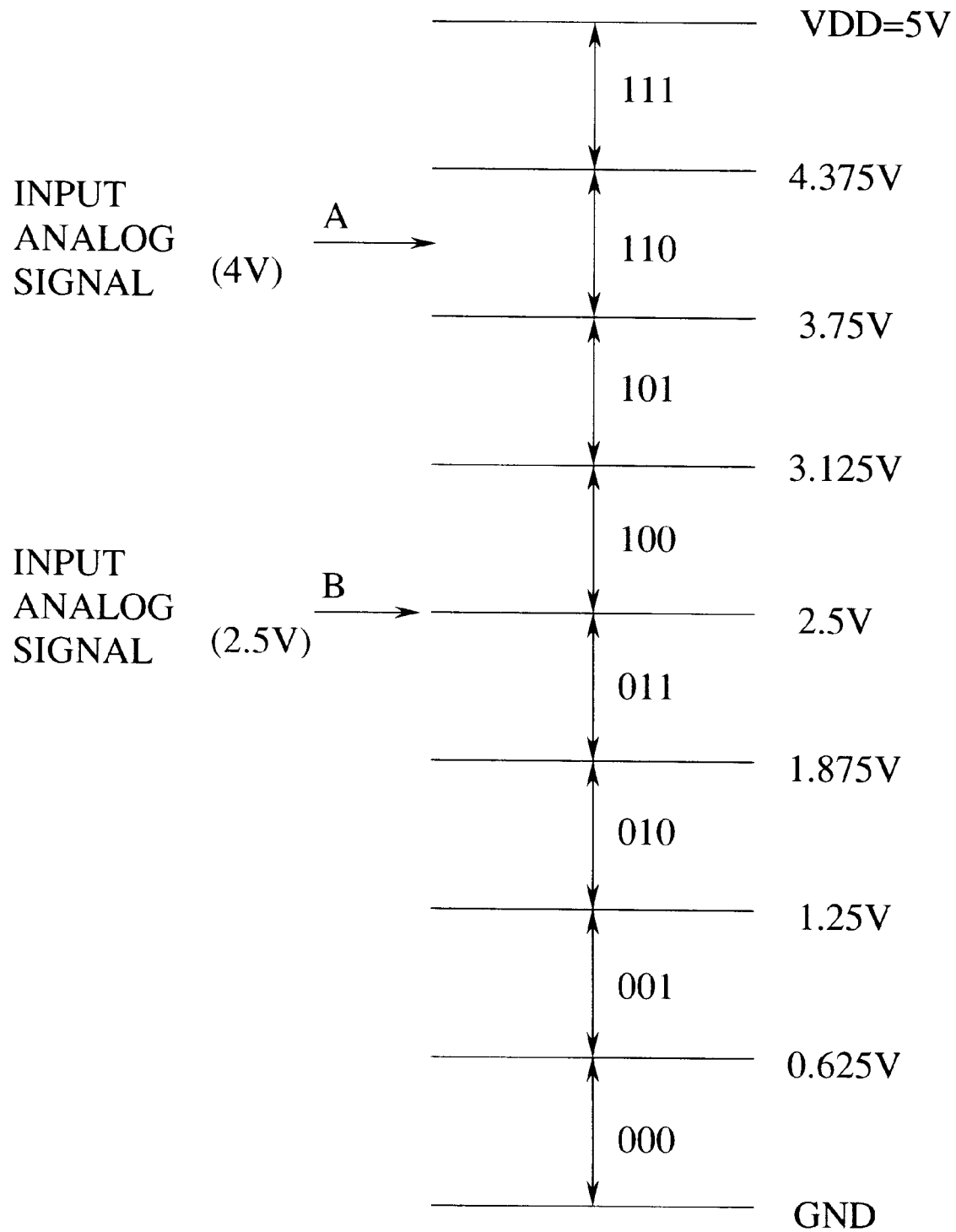
FIG. 7 is a schematic view showing the operation of the analog-digital converter in the digital volume controller as illustrated in FIG. 4.
Figure 8A:
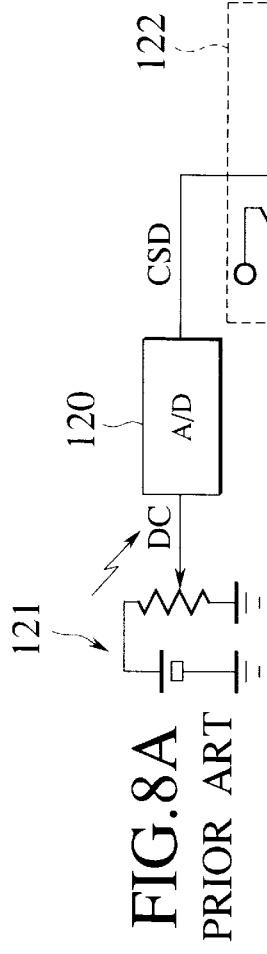
FIG. 8 is a diagram for explaining shortcomings in the operation of the conventional analog-digital converter.
Figure 8B:
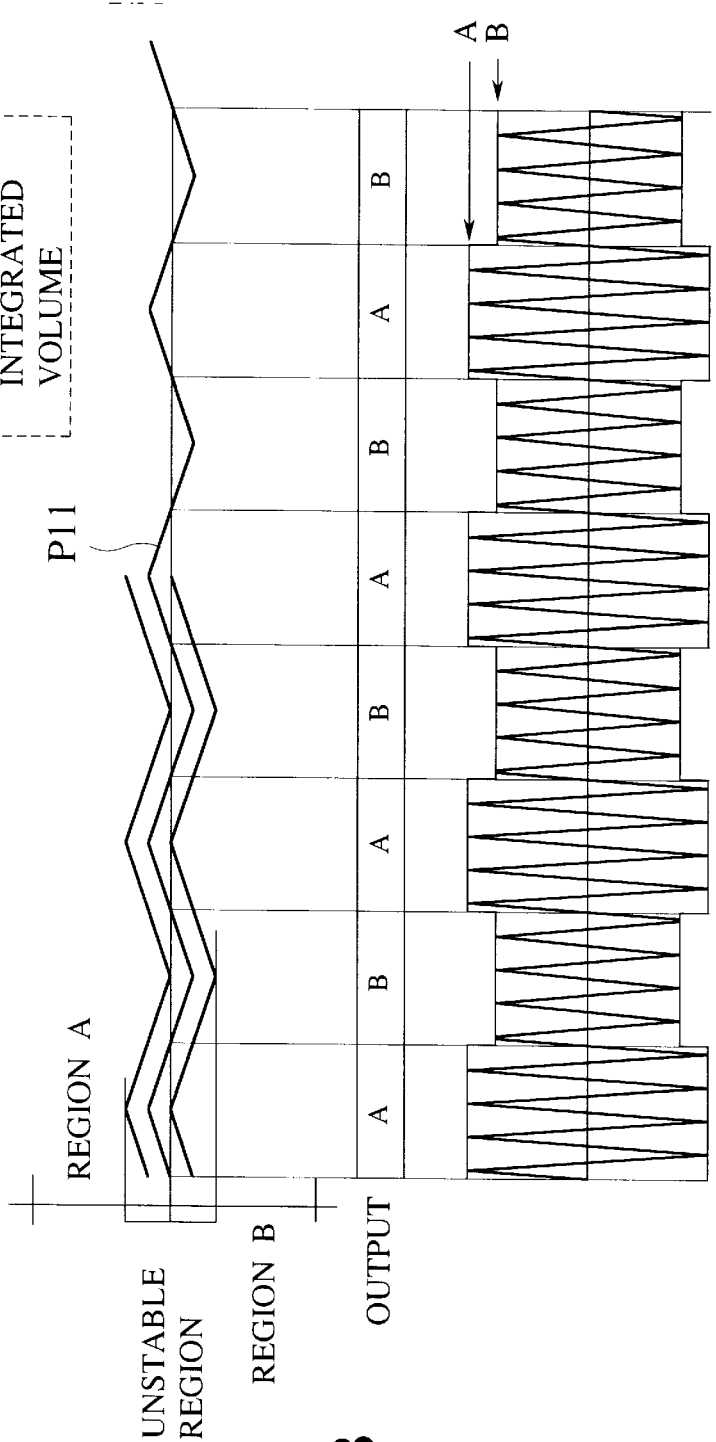
Figure 10:
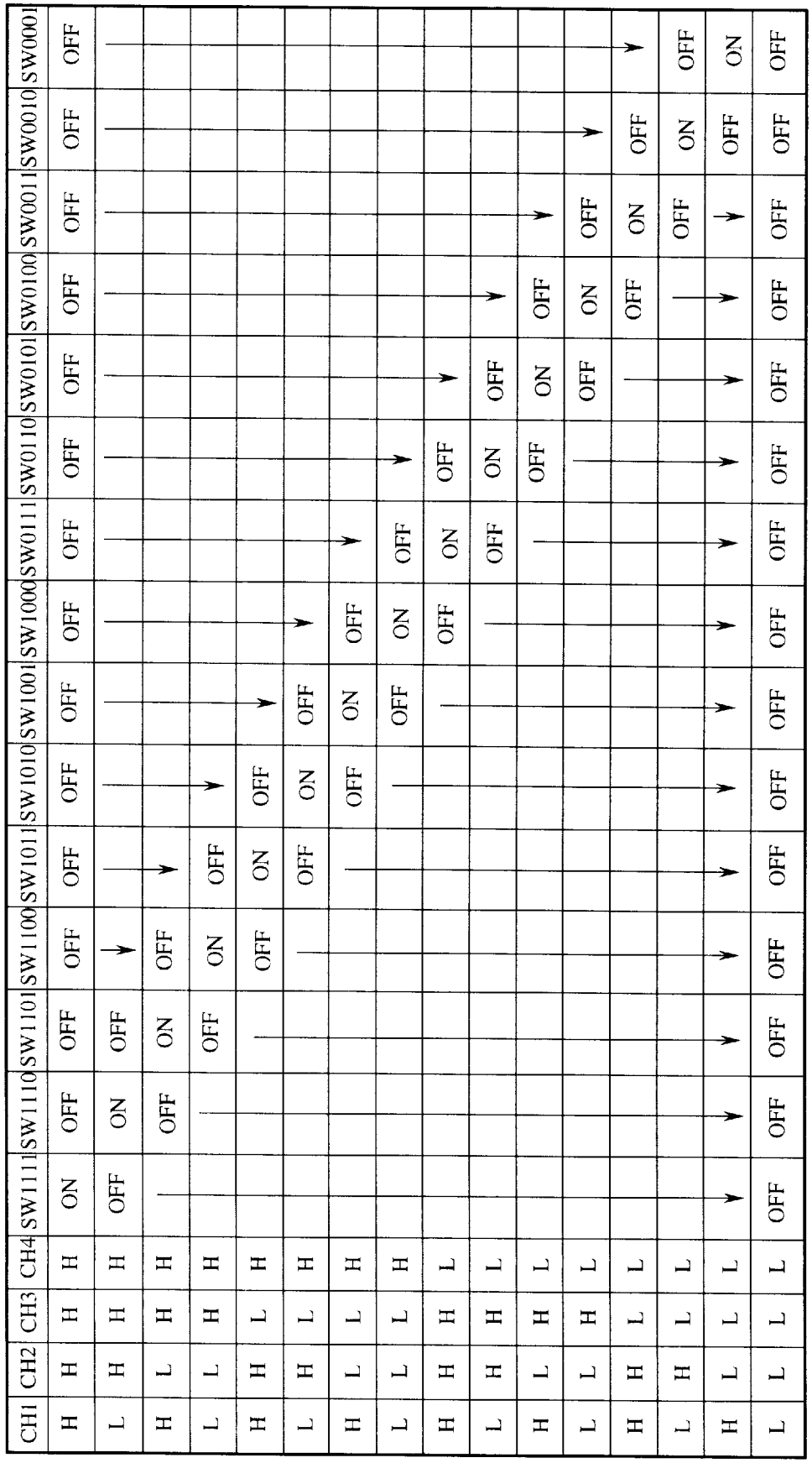
FIG. 10 is a schematic diagram showing the operation of the analog switches, under the control of the decoder as illustrated in FIG. 9.

For example, the analog switches SW1111 to SW0001 can be designed as illustrated in FIG. 1(b), and turned on/off in accordance with the potential levels of the clock signals CK1 to CK4 output from the clock signal generator 38, as illustrated in FIG. 10, under the control of a 4-bit to 15-levels decoder 32. On the other hand, the clock signals CK1 to CK4 are supplied to the D-terminal of a 4-bit register 35.

Figure 11:
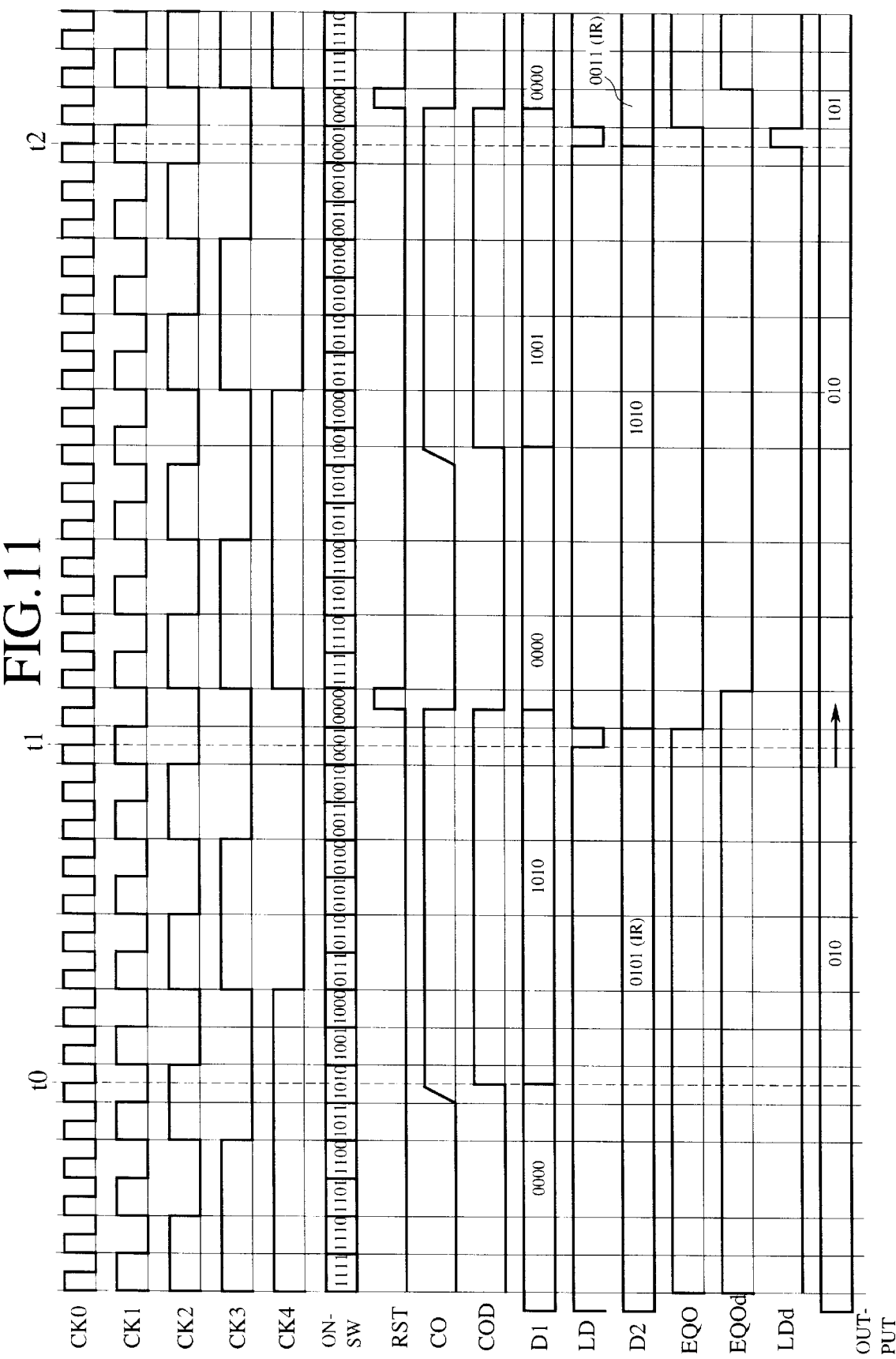
FIG. 11 is a timing chart showing the operation of the analog-digital converter in accordance with the first embodiment of the present invention.

In this case, the clock signals CK1 to CK4 are generated in the clock signal generator 38 by dividing the clock signal CK0 as illustrated in FIG. 11. On the other hand, the clock signal CK0 is supplied to the D-type flip-flop 34 and the D-type flip-flop 39. Also, the clock signal generator 38 serves to generate the reset signal RST supplied to the 4-bit parallel-in-parallel-out (PIPO) register 35 and the clock signal LD supplied to the 4-bit parallel-in-serial-out (PISO) register 36.

In accordance with the operation of the analog-digital converter, the analog switches SW1111 to SW0001 are turned on in sequence, the output voltage thereof and the signal level INPUT of the analog signal as inputted are compared with each other by means of the comparator 33. When the conversion potential level as outputted from the conversion level output circuit 31 becomes lower than the signal level INPUT of the analog signal as inputted (i.e., when the analog switches SW1010 is turned on in this case), the comparison output level CO of the comparator 33 rises to the "H" level, in response to which the output signal COD of the D-type flip-flops 34 rises also to the "H" level at time t0 as illustrated in FIG. 11.

When the output signal COD of the D-type flip-flops 34 rises also to the "H" level, the output signal D1 of the register 35 changes from the reset state outputting a NULL signal of [0000] to an active state outputting the analog-digital conversion codes of [1010]. At this time, as illustrated in FIG. 11, it is assumed that the output signal D2 of the register 36 is [0101] corresponding to a ignoring region and that the 3-bit parallel-in-serial-out (PISO) register 37 connected to the output nodes of the register 36 is outputting the analog-digital conversion code of [010].

Namely, the least significant bit of the output signal D2 of the register 36 is such a bit as indicative of whether or not the analog signal as inputted is currently within one of the ignoring regions. In this example, the least significant bit of "1" is indicative of an ignoring regions. The least significant bit is supplied to the D-terminal of the flip-flop 39 as the EQO signal. The EQO signal and the LD signal output from the flip-flop 39 are input to the NOR gate 40, which in turn outputs the clock signal LDd to the 3-bit register 37 in order that the most significant 3 bits of the output signal D2 of the register 36 is supplied to the D-terminal of the register 37.

In this case, the register 36 and the register 37 are activated respectively when the LD signal and the LDd signal rise in order to output the latched signals as input from the D-terminal.

At time t1, while the LD signal takes the "L" level, the signal is maintained at the "H" level, since the output signal D2 of the register 36 is maintained at [0101] corresponding to one of the ignoring regions. Accordingly, the EQOd signal and the LDd signal are maintained respectively at the "H" level and the "L" level. As a result, the analog-digital conversion code of [010] is maintained from the previous period (t0 to t1) and is outputted as the output signal OUTPUT.

Since the LD signal rises a half clock after the time t1, the register 36 outputs the output signal D2 of [1010], which is the analog-digital conversion code of the output signal D1 of the register 35. The analog-digital conversion code [1010] is not indicative of one of the ignoring regions so that the EQO signal becomes the "L" level and, one clock later, the EQOd signal also becomes the "L" level.

Thereafter, the above operations are repeated in the same manner as the previous period until the LD signal is pulled down at time t2. In this case, however, since the EQOd signal is in the "L" level, the LDd signal rises to the "H" level. As a result, the most significant 3 bits [101], which is different than that in the previous period (t1 to t2) is outputted from the register 37 as the output signal OUTPUT.

Figure 12:
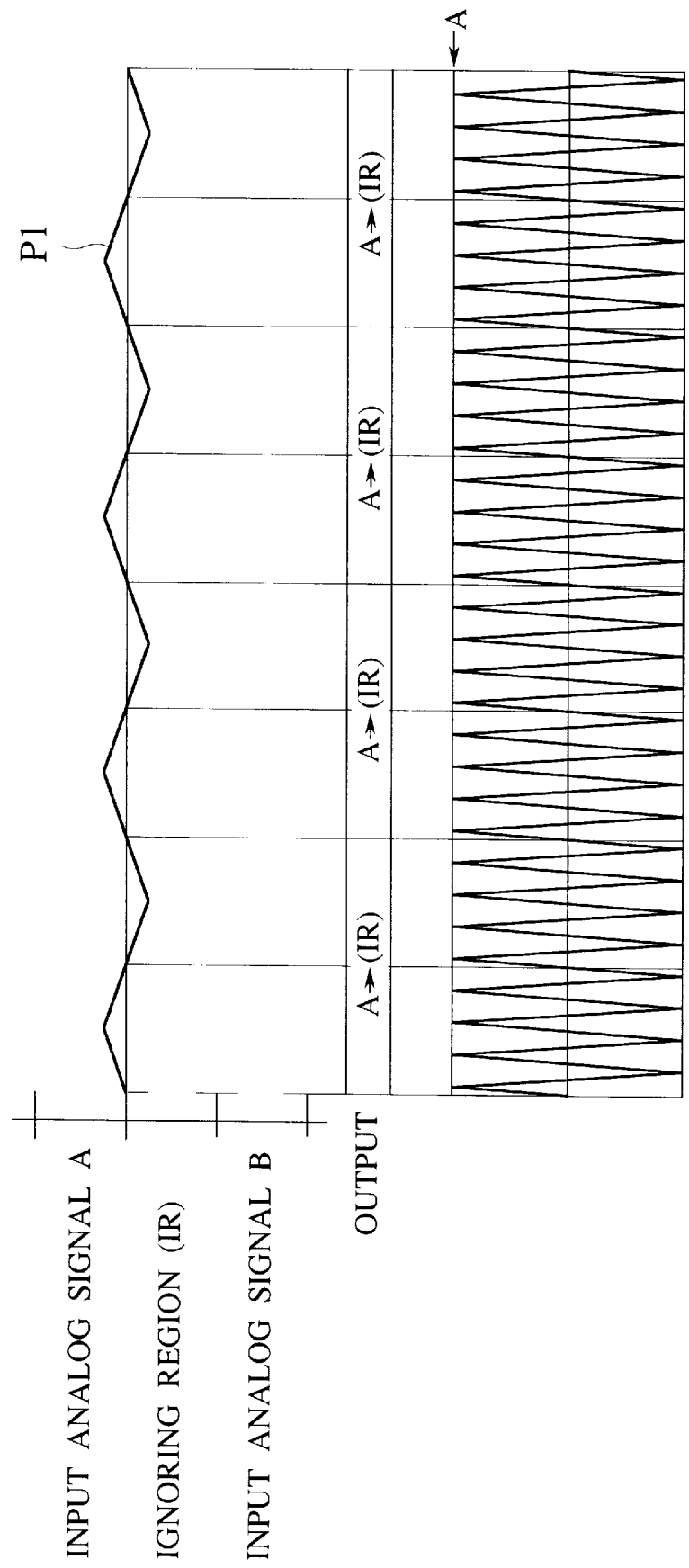
FIG. 12 is an explanatory view showing the advantages in accordance with the first embodiment of the present invention.
Figure 13:
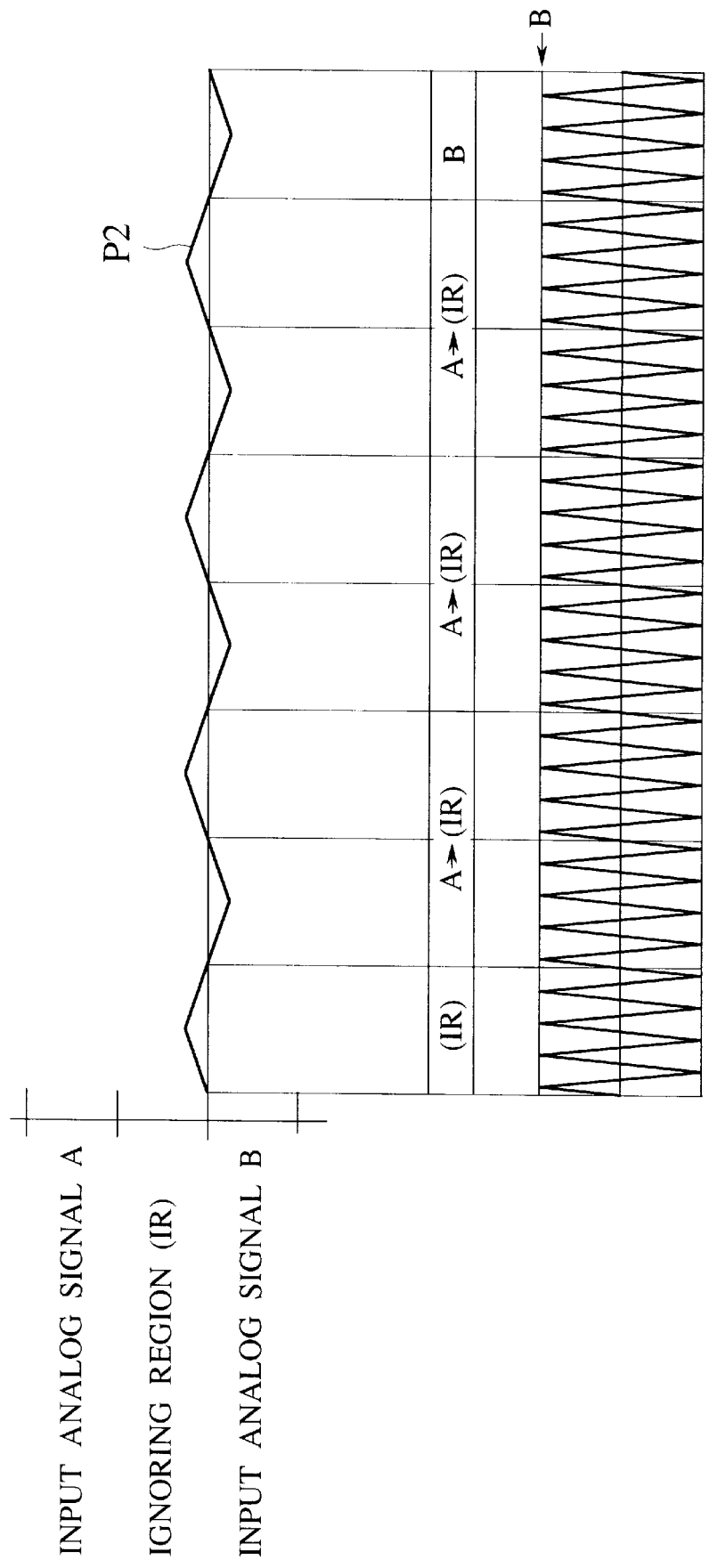
FIG. 13 is an explanatory view showing the advantages in accordance with the first embodiment of the present invention.

In the case of this embodiment of the present invention in which the ignoring regions are provided between adjacent analog-digital conversion regions, the register 37 outputs the analog-digital conversion code of the previous period when the signal level of the analog signal as inputted is located within one of the ignoring regions. By this configuration, as illustrated in FIG. 12 and FIG. 13, even when a signal is input in the vicinity of the boundary between adjacent analog-digital conversion regions, i.e., near one of the analog conversion levels, it is no longer the case the analog-digital conversion code OUTPUT as output fluctuates due to the noise mixed to the input analog signal.

Figure 14:
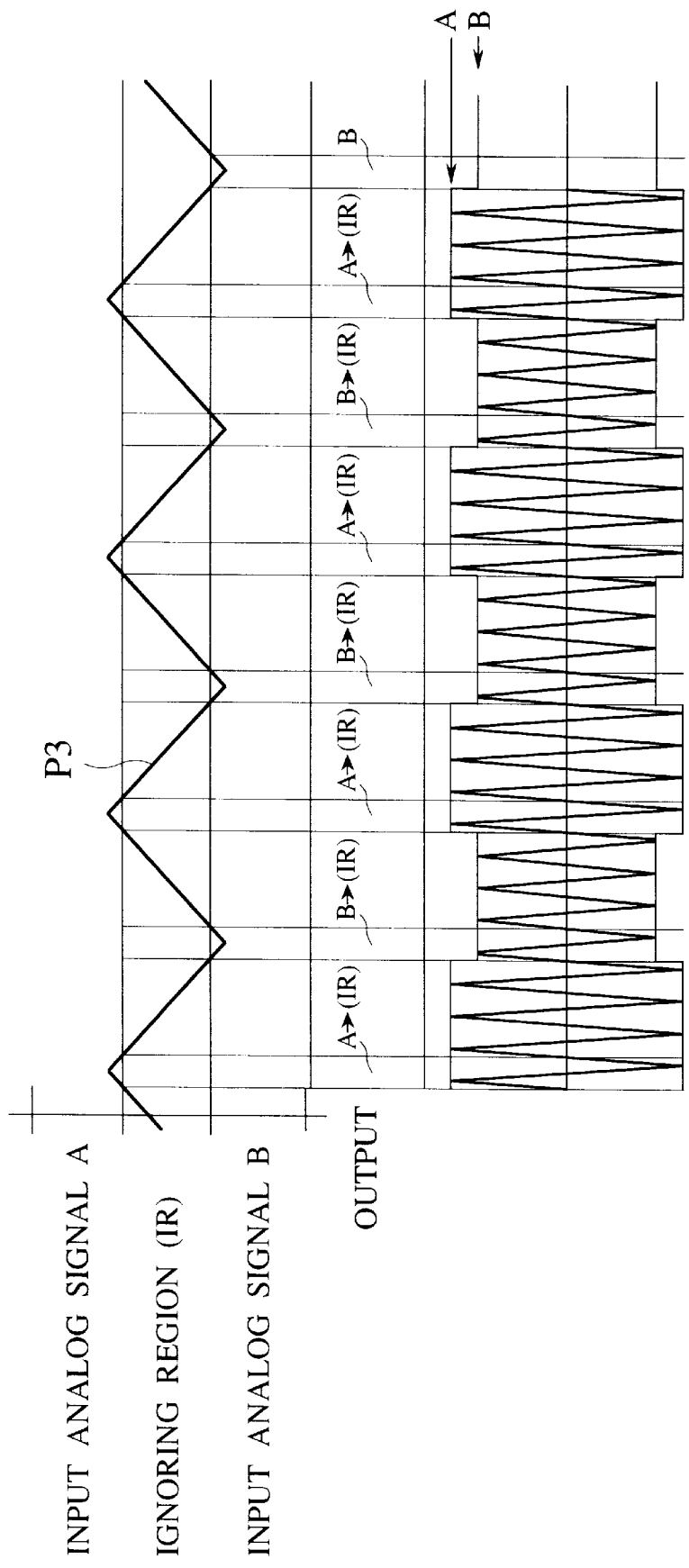
FIG. 14 is an explanatory view showing the situation that significant noise appear in the input analog signal with magnitudes larger than the width of the ignoring regions.
Figure 15:
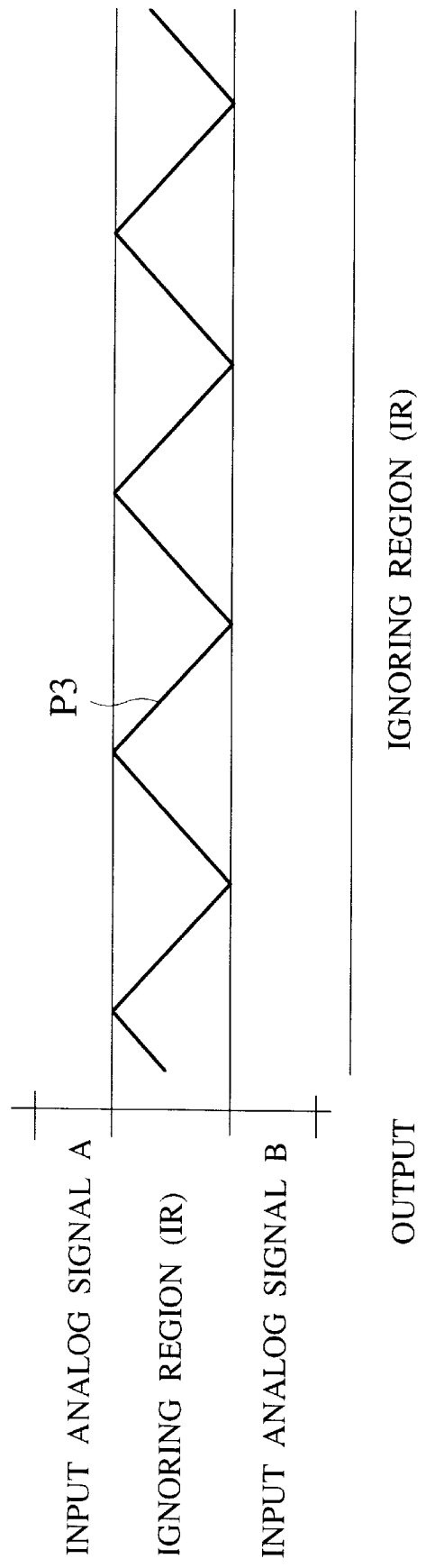
FIG. 15 is an explanatory view showing the situation that the shortcoming can to eliminated to the best by increasing the width of the ignoring regions in order to overcome the fluctuation of noise as illustrated in FIG. 14.

Meanwhile, when significant noise appear in the input analog signal with magnitudes larger than the width of the ignoring regions, it can be the case the analog-digital conversion code OUTPUT fluctuates due to the significant noise in the same manner as the prior art technique as illustrated in FIG. 14. In this case, however, the shortcoming can to eliminated to the best by increasing the width of the ignoring regions in order to overcome the fluctuation of noise.

Next, the second embodiment of the present invention will be explained.

Figure 16:
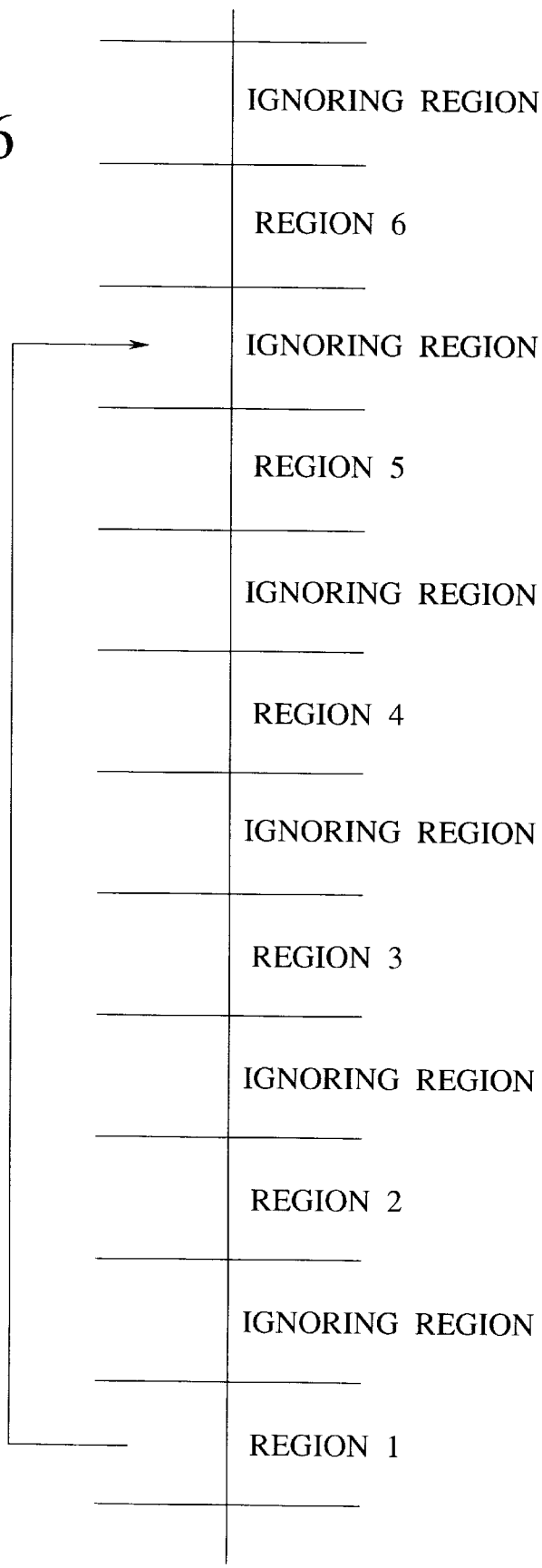
FIG. 16 is an explanatory view showing the situation that the shortcoming can to eliminated to the best by increasing the width of the ignoring regions in order to overcome the fluctuation of noise as illustrated in FIG. 14.

In the case of the first embodiment as described above, when the signal level of the analog signal as inputted jumps from the analog-digital conversion regions 1 to separate one of the ignoring regions without any intervening level, as illustrated in FIG. 16, the analog-digital conversion code is maintained at the code corresponding to the potential level 1 even after the jump. This shortcoming does usually not become a practical problem since the signal level of the analog signal as inputted changes at a slow speed as compared with the sampling ratio of the analog-digital conversion in many cases. However, when the practical problem occurs, there must be taken some measure to meet it. The second embodiment is directed to the problem.

Figure 17:
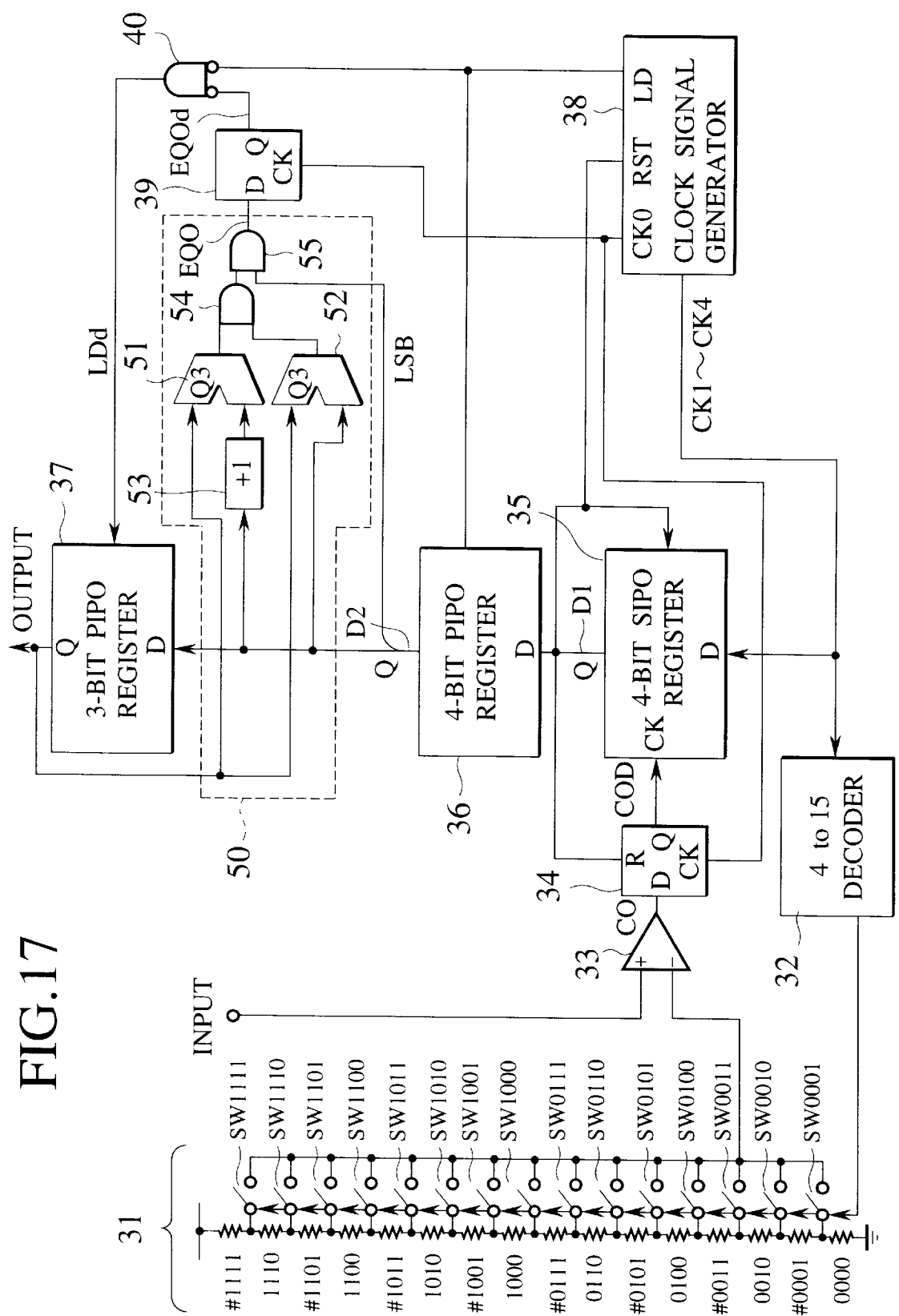
FIG. 17 is a circuit diagram showing the configuration of an analog-digital converter in accordance with a second embodiment of the present invention.

FIG. 17 is a circuit diagram showing the configuration of an analog-digital converter in accordance with a second embodiment of the present invention. While these constituents elements have the same structures and functions of the previous embodiment, detailed explanation is not repeated.

In the case of this embodiment of the present invention, a circuit 50 is provided in addition to the configuration as illustrated in FIG. 9. Namely, in the case that the signal level of the analog signal INPUT as inputted is located within one of the ignoring regions, the circuit 50 is operated to output the analog-digital conversion code of the previous period when the signal level of the analog signal INPUT is located adjacent to the analog conversion level corresponding to the analog-digital conversion code of the previous period while the circuit 50 is operated to output the analog-digital conversion code of the previous period when the signal level of the analog signal INPUT is not located adjacent to the analog conversion level corresponding to the analog-digital conversion code of the previous period.

Figure 18A:
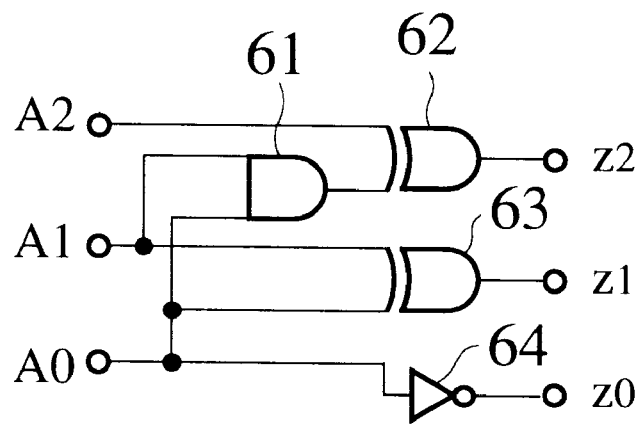
FIG. 18(a) is a circuit diagram showing of a three-bit increment circuit in accordance with the second embodiment of the present invention.
Figure 18B:
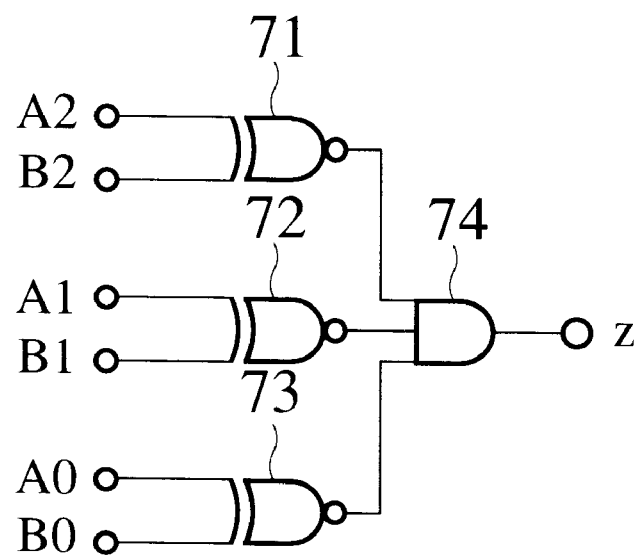
FIG. 18(b) is a circuit diagram showing of a three-bit agreement detection circuit in accordance with the second embodiment of the present invention.

The circuit 50 is composed of a pair of three-bit agreement detection circuits 51 and 52, a three-bit increment circuit 53, a 2-input OR gate 54 and a 2-input AND gate 55. The three-bit agreement detection circuits 51 and 52, the three-bit increment circuit 53 and the 2-input OR gate 54 functions as a neighboring location detecting circuit in combination. The three-bit increment circuit 53 is composed of the AND gate 61, exclusive OR circuits 62 and 63 and an inverter 64, as illustrated in FIG. 18(a). On the other hand, the three-bit agreement detection circuits 51 and 52 are composed respectively of exclusive NOR circuits 62 and 63 and a 3-input AND gate 74, as illustrated in FIG. 18(b).

Figure 19:
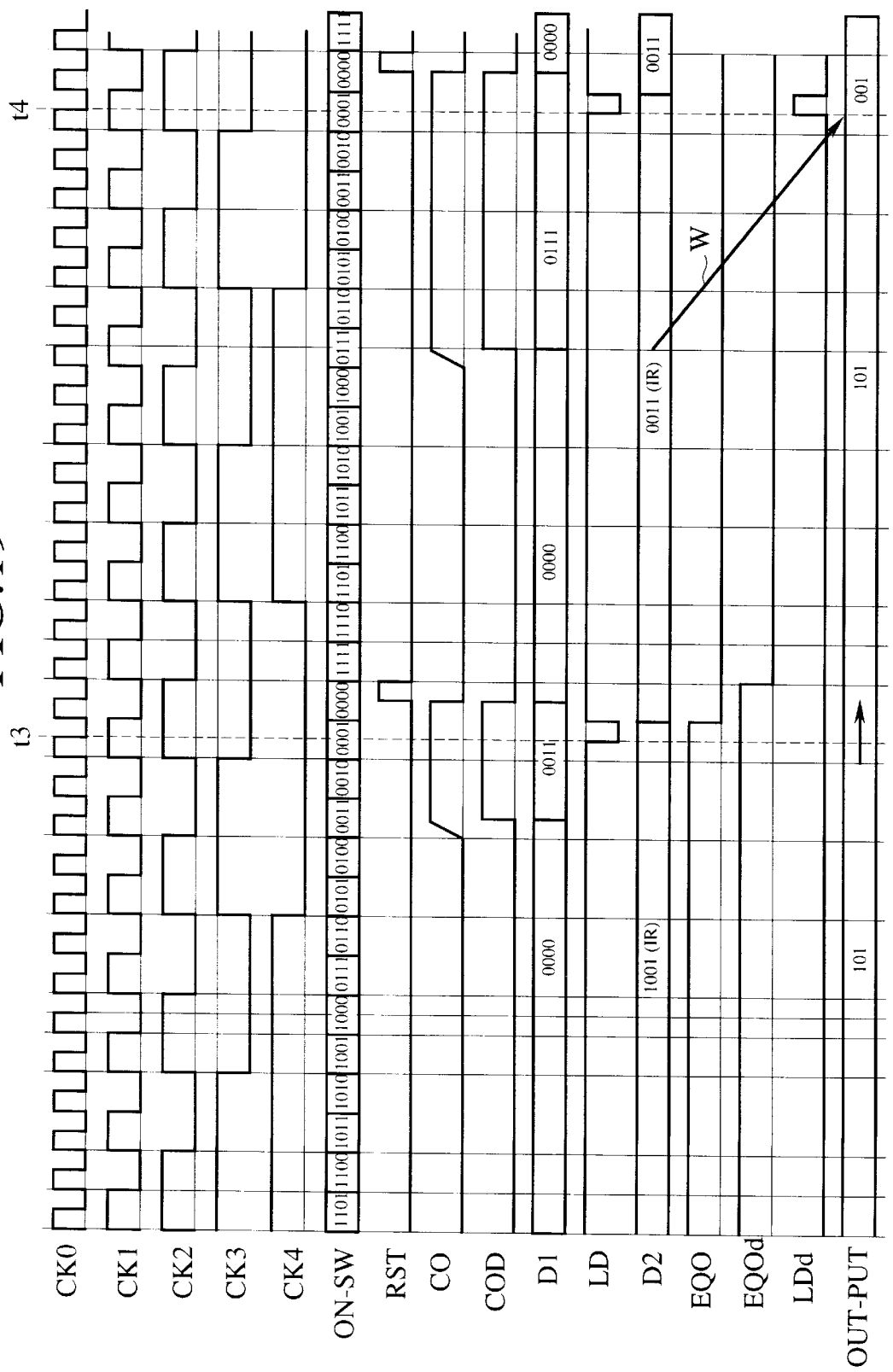
FIG. 19 is a timing chart showing the operation of the analog-digital converter in accordance with the second embodiment of the present invention.

FIG. 19 is a timing chart showing the operation of the analog-digital converter in accordance with this embodiment of the present invention. The timing chart as illustrated in FIG. 11 is also the case of this embodiment of the present invention. The following explanation is directed particularly to the case that the signal level of the analog signal as inputted jumps from the analog-digital conversion regions 1 to separate one of the ignoring regions without any intervening level.

In the same figure, the output signal D2 of the register 36 is the analog-digital conversion code of [0011] corresponding to an ignoring region in the period from time t3 to time t4. However, the location of the ignoring region is not adjacent to the analog conversion level of [1010] corresponding to the analog-digital conversion code of [101] as previously outputted from the register 36. The LDd signal therefore rises up to the "H" level as illustrated in FIG. 19 with arrow W, and therefore the output signal D2 of the register 36 is loaded to the register 37, which subsequently outputs the analog-digital conversion code of [101] as the output signal OUTPUT. By this configuration, the above described shortcoming can be eliminated.

Figure 20:
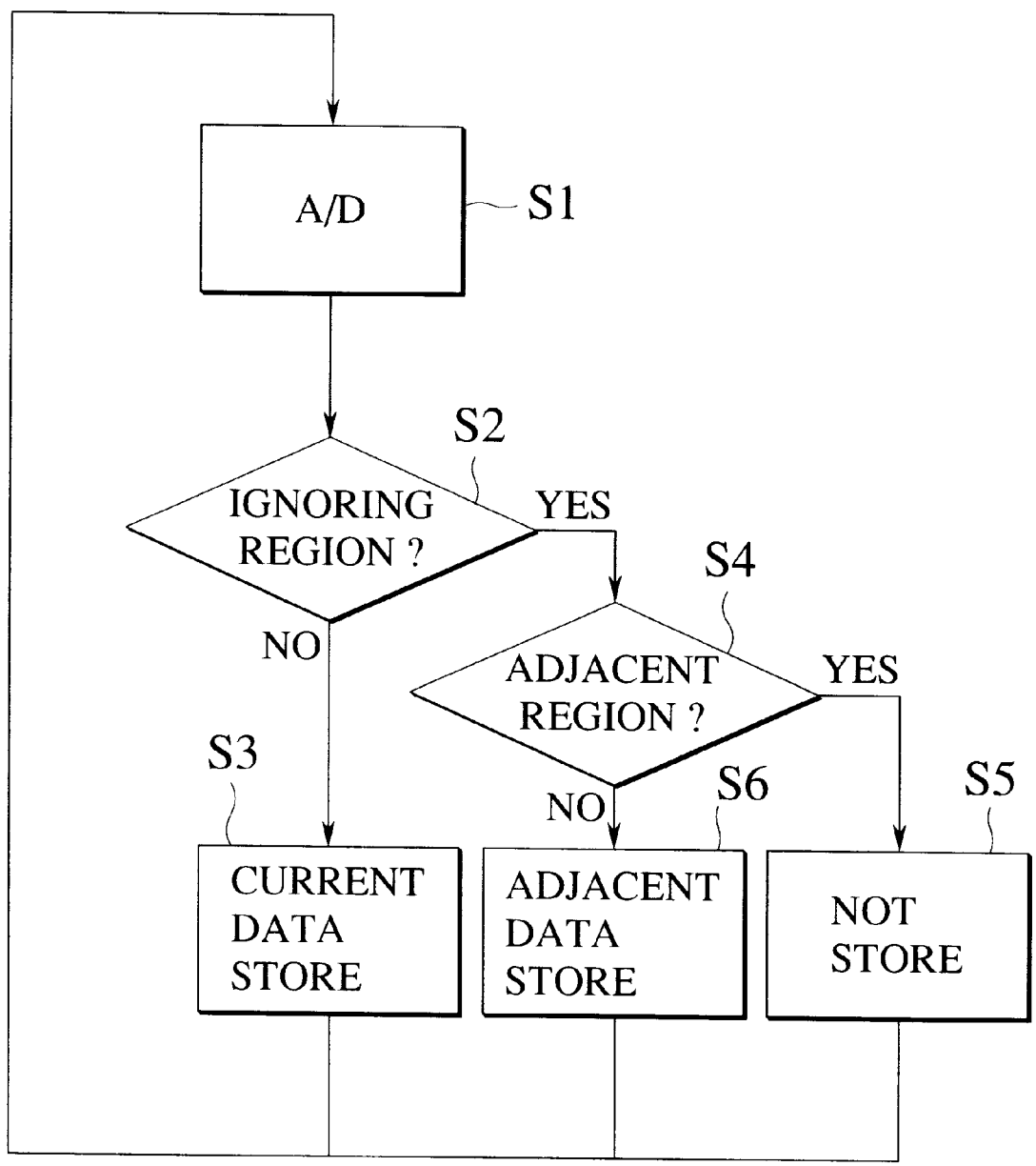
FIG. 20 is a flowchart showing the algorithm of the software control for implementing the algorithm in accordance with the second embodiment of the present invention.

Alternatively, the equivalent function to the circuit 50 can be implemented by means of software control. FIG. 20 is a flowchart showing the algorithm of the software control.

In the step S1, the analog-digital conversion is conducted. In the step S2, it is judged whether or not the conversion code is corresponding to one of the ignoring regions. In the step S3, if the conversion code is not corresponding to one of the ignoring regions, the conversion code is output as the output signal of the analog-digital converter. If the analog-digital conversion code is corresponding to one of the ignoring regions in the step S3, it is judged whether or not the analog-digital conversion code is such as located adjacent to the analog-digital conversion code of the previous period in the step S4. If "YES" in the step S4, the analog-digital conversion code of the previous period is output without change. However, if "NO" in the step S4, the current analog-digital conversion code just upward or downward adjacent to said one of the ignoring regions is output.

Figure 21B:
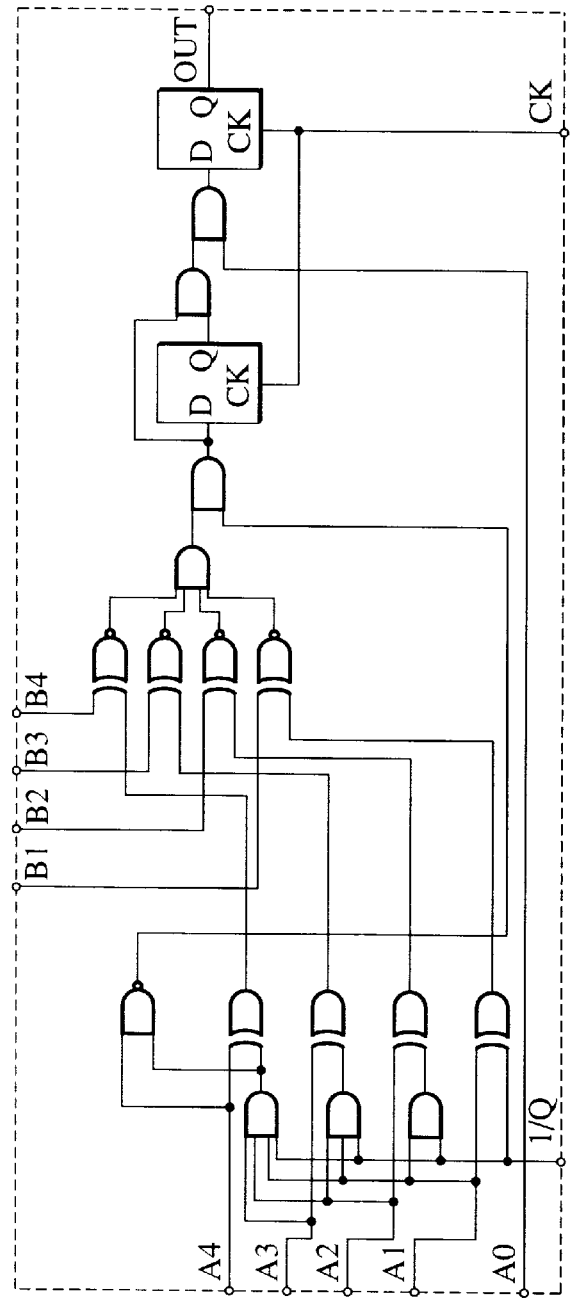
FIG. 21(b) is a circuit diagram of an FKN sub-block in FIG. 21(a).
Figure 22:
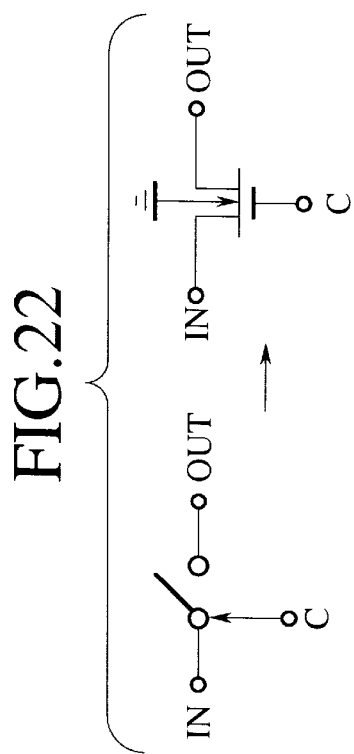
FIG. 22 is an example of analog switches SW00001~SW11111 in FIG. 21(a).

FIG. 21 is a circuit diagram showing the configuration of an analog-digital converter in accordance with a third embodiment of the present invention.

The analog-digital converter as illustrated in FIG. 21 is an analog-digital converter with the resolution of 4-bit provided with a conversion level output circuit 81. Also in this case, the conversion level output circuit 81 is characterized by ignoring regions which feature the present invention. The conversion level output circuit 81 is composed of a series of resistors connected in serial between a power source line VDD and the ground GND for generating the conversion potential levels respectively corresponding to the analog-digital conversion codes, and a series of analog switches connected to the connection points of the series of the resistors. The number of the series of the resistors is double the number of the prior art 4-bit analog-digital converter also with double the number of the analog switches. Namely, the conversion level output circuit 81 is designed in the form of a 5-bit analog-digital converter.

Accordingly, the conversion level output circuit 81 is provided with 32 resistors to output the conversion potential levels corresponding to the analog-digital conversion codes of [11110], [11100], [11010], [11000], [10110], [10100], [10010], [10000], [01110], [01100], [01010], [01000], [00110], [00100], [00010] and [00000] as well as intermediate levels between adjacent analog-digital conversion regions forming ignoring regions. The intermediate levels are corresponding to the analog-digital conversion codes of [11111], [11101], [11011], [11001], [10111], [10101], [10011], [10001], [01111], [01101], [01011], [01001], [00111], [00101], [00011] and [00001] which are distinguished by making with "#" in the figure. Also, there are provided with a number of analog switches SW11111 to SW00001 respectively corresponding to the series of the resistors.

For example, the analog switches SW11111 to SW0001 can be designed as illustrated in FIG. 1(b), and turned on/off in accordance with the potential levels of a 5-bit register 85, under the control of a 5-bit to 31-levels decoder 82. On the other hand, the 5-bit output is supplied to the D-terminal of a 5-bit register 86.

Figure 23:
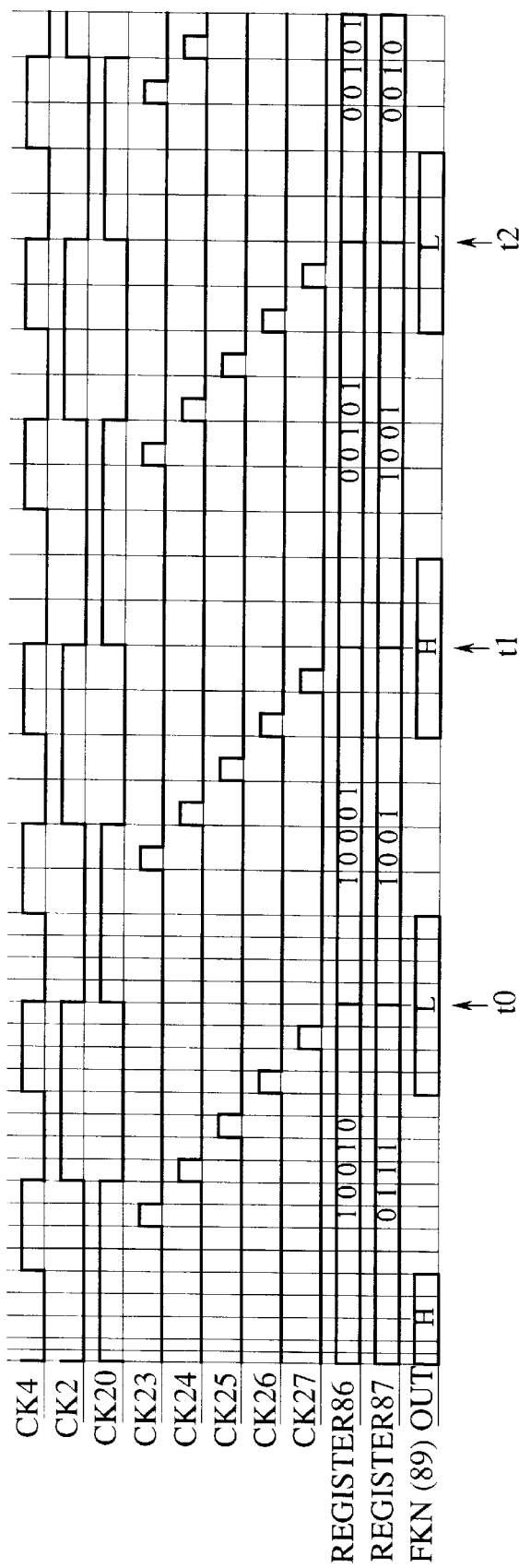
FIG. 23 is a timing chart showing the operation of the A/D converter of the third embodiment.

In this case, the clock signals CK23 to CK27 are generated in the clock signal generator 88 as illustrated in FIG. 23. On the other hand, the clock signals CK2, CK4 are supplied to the FKN 89. Also, the clock signal generator 88 serves to generate the clock signal supplied to the 4-bit parallel-in-parallel-out (PIPO) register 87 and the clock signal CK20 supplied to the 5-bit parallel-in-parallel-out (PIPO) register 86.

In accordance with the operation of the analog-digital converter, the analog switches SW11111 to SW00001 are turned on in a binary-tree fashion as detailedly explained in the following, the output voltage thereof and the signal level INPUT of the analog signal as inputted are compared with each other by means of the comparator 83.

The above sequence will be explained with reference to FIG. 24.

STEP 1: The signal CK23 changes to H to set 10000 in the register 85 and turn on the analog switch SW10000 through the decoder 82. If every resistor of the conversion level output unit 81 has an identical value, the unit 81 generates a voltage of VDD/2 (intermediate potential). If the voltage INPUT is greater than the conversion level voltage, the output of the comparator 83 is H, and the register a in the 5-bit register 85 becomes H when the signal CK24 rises. If the voltage INPUT is lower than the conversion level voltage, the output of the comparator 83 is L, and the register a becomes L when the signal CK24 rises.

The register b in the 5-bit register 85 is set to H when the signal CK24 rises.

STEP 2: If the register a is H, the register 85 holds 11000 to turn on the switch SW11000. Similar to STEP 1, this voltage is compared with the voltage INPUT. If the voltage INPUT is greater, the register b becomes H when the signal CK25 rises, and if the voltage INPUT is smaller, the register b becomes L when the signal CK rises.

If the register a is L, the register 85 holds 01000 to turn on the switch SW01000. Like STEP 1, this voltage is compared with the voltage INPUT. If the voltage INPUT is greater, the register b becomes H when the signal CK25 rises, and if the voltage INPUT is smaller, the register b becomes L when the signal CK25 rises.

The register c in the 5-bit register 85 is set to H when the signal CK25 rises.

STEP 3: If the registers a and b are each H, the register 85 holds 11100 to turn on the switch SW11100. Like STEP 1, this voltage is compared with the voltage INPUT. If the voltage INPUT is greater, the register c becomes H when the signal CK26 rises, and if the voltage INPUT is smaller, the register c becomes L when the signal CK26 rises.

If the registers a and b are H and L, the register 85 holds 10100 to turn on the switch SW10100. If the voltage INPUT is greater, the register c becomes H when the signal CK26 rises, and if the voltage INPUT is smaller, the register c becomes L when the signal CK26 rises.

If the registers a and b are L and H, the register 85 holds 01100 to turn on the switch SW01100. If the voltage INPUT is greater, the register c becomes H when the signal CK26 rises, and if the voltage INPUT is smaller, the register c becomes L when the signal CK26 rises.

If the registers a and b are each L, the register 85 holds 00100 to turn on the switch SW00100. If the voltage INPUT is greater, the register c becomes H when the signal CK26 rises, and if the voltage INPUT is smaller, the register c becomes L when the signal CK26 rises.

The register d in the 5-bit register 85 is set to H when the signal CK26 rises.

STEP 4: If the registers a, b, and c are H, H, and H, the register 85 holds 11110 to turn on the switch SW11110. Like STEP 1, this voltage is compared with the voltage INPUT. If the voltage INPUT is greater, the register d becomes H when the signal CK27 rises, and if the voltage INPUT is smaller, the register d becomes L when the signal CK26 rises.

If the registers a, b, and c are H, H, and L, the register 85 holds 11010 to turn on the switch SW11010. If the voltage INPUT is greater, the register d becomes H when the signal CK27 rises, and if the voltage INPUT is smaller, the register d becomes L when the signal CK27 rises.

If the registers a, b, and c are H, L, and H, the register 85 holds 10110 to turn on the switch SW10110. If the voltage INPUT is greater, the register d becomes H when the signal CK27 rises, and if the voltage INPUT is smaller, the register d becomes L when the signal CK27 rises.

If the registers a, b, and c are H, L, and L, the register 85 holds 10010 to turn on the switch SW10010. If the voltage INPUT is greater, the register d becomes H when the signal CK27 rises, and if the voltage INPUT is smaller, the register d becomes L when the signal CK27 rises.

If the registers a, b, and c are L, H, and H, the register 85 holds 01110 to turn on the switch SW01110. If the voltage INPUT is greater, the register d becomes H when the signal CK27 rises, and if the voltage INPUT is smaller, the register d becomes L when the signal CK27 rises.

If the registers a, b, and c are L, H, and L, the register 85 holds 01010 to turn on the switch SW01010. If the voltage INPUT is greater, the register d becomes H when the signal CK27 rises, and if the voltage INPUT is smaller, the register d becomes L when the signal CK27 rises.

If the registers a, b, and c are L, L, and H, the register 85 holds 00110 to turn on the switch SW001110. If the voltage INPUT is greater, the register d becomes H when the signal CK27 rises, and if the voltage INPUT is smaller, the register d becomes L when the signal CK27 rises.

If the registers a, b, and c are L, L, and L, the register 85 holds 00010 to turn on the switch SW00010. If the voltage INPUT is greater, the register d becomes H when the signal CK27 rises, and if the voltage INPUT is smaller, the register d becomes L when the signal CK27 rises.

The register e in the 5-bit register 85 is set to H when the signal CK27 rises.

Figures 25A, 25B:
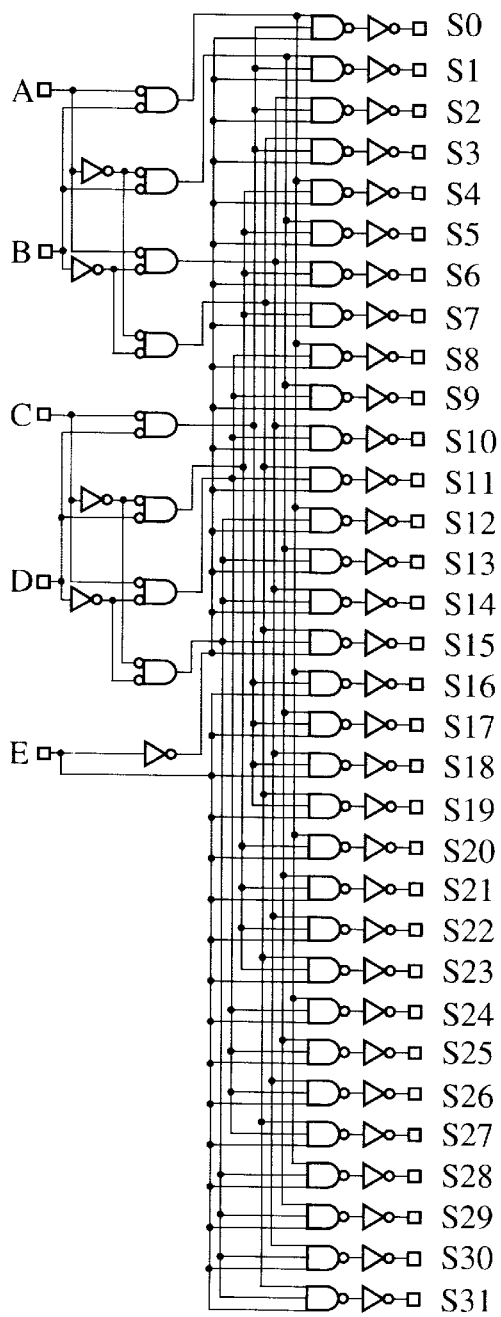
FIG. 25(a) is a circuit diagram showing a 5 to 31 decoder which is suitable for use in the analog-digital converter in accordance with this embodiment.
FIG. 25(b) is a table showing the relationship between the output signal of the register 85 and the on/off states of the analog switches of the conversion level output circuit 81.

STEP 5: When the register e is set to H at a rise of the signal CK27, the value of the 5-bit register is defined to select an analog switch. If the voltage INPUT is greater in this state, the LSB register in the 5-bit PIPO register 86 becomes H when the signal CK20 rises, and if the voltage INPUT is smaller, the LSB register becomes L when the signal CK20 rises. This determines an A/D conversion value. Also, FIG. 25(a) is a circuit diagram showing the internal configuration of the 5-bit to 31-levels decoder 82. The SIPO register 85 is composed of five D-type flip-flops 85a to 85e, which receive the clock signals CK23 to CK27 respectively.

The clock signals CK2, CK4, CK20, CK23 to CK27 rise one after another in order as illustrated in FIG. 23. In synchronism, as shown in FIG. 24, the comparison result by the comparator 83 is stored in the D-type flip-flops 85a to 85e in sequence, i.e, from the D-type flip-flop 85a to the D-type flip-flop 85e. The control signals of the analog switches of the conversion level output circuit 81 are generated by the decoder 82. FIG. 25(b) is a table showing the relationship between the output signal of the register 85 and the on/off states of the analog switches of the conversion level output circuit 81.

Namely, the conversion level output circuit 81 is adapted to generate a plurality of reference voltage levels and selectively output one of the reference voltage levels, i.e, corresponding to the voltage levels between adjacent ones of the resistors of the conversion level output circuit 81. The decoder 82 is connected to the conversion level output circuit 81 and adapted to output a control signal in order to control the analog-digital conversion code generating circuit to periodically output one of the reference voltage levels in turn.

The comparator 83 is provided for comparing the signal level of an analog signal as inputted with the reference voltage levels in order to output comparison result which determine the signal level of the analog signal as inputted respective to the reference voltage levels.

The 5-bit register 85 is provided for outputting an analog-digital conversion code of the analog signal in accordance with the comparison result of the comparator. The conversion code determined by this sequence is supplied to the 5-bit PIPO register 86 when the signal CK20 rises. If the LSB of the conversion code is 1, the code is a dead zone code, and therefore, the output of the dead zone detection circuit (FKN) 89 is H to connect the switch group 90 to the H-side. As a result, the value written in the register 86 is not written into the 4-bit PIPO register 87, which holds the previous value. In this way, if a dead zone code is provided, the previous data is kept. If a jump is made from a dead zone to an unadjacent dead zone as shown in FIG. 16, the detection circuit (FKN) 89 detects this, and a conversion code next to the new dead zone is written into the register 87.

Referring to the timing chart of FIG. 23, the register 86 has 10010 before t0. This is not a dead zone, and therefore, FKN OUT at t0 is L to connect the switch group 90 to the L-side. As a result, the register 87 is rewritten to 1001 at t0. If the register 86 has been rewritten to 10001 at t0, this value is in a dead zone adjacent to data in the previous cycle. As a result, FKN OUT becomes H to connect the switch group 90 to the L-side. At t1, the register 87 keeps the previous value. If the register 86 is changed to 00101 at t1, this value is in a dead zone but not adjacent to the previous value. Namely, it is a jumped value, and therefore, FKN OUT becomes L to rewrite the register 87 to 0010 at t2. Particularly, in accordance with this embodiment of the present invention, comparison of the signal level of an analog signal as inputted with the reference voltage levels is performed by a binary-tree algorithm.

The binary-tree algorithm in this description is designed such that comparison of the signal level of an analog signal as inputted with the reference voltage levels is performed by repeating the steps of comparing the signal level of an analog signal as inputted with intermediate one of the reference voltage levels to be compared, and narrowing the number of the reference voltage levels to be compared by excluding those of the reference voltage levels which are higher or lower than said intermediate one of the reference voltage levels in accordance with the respective comparison result.

Figure 24:
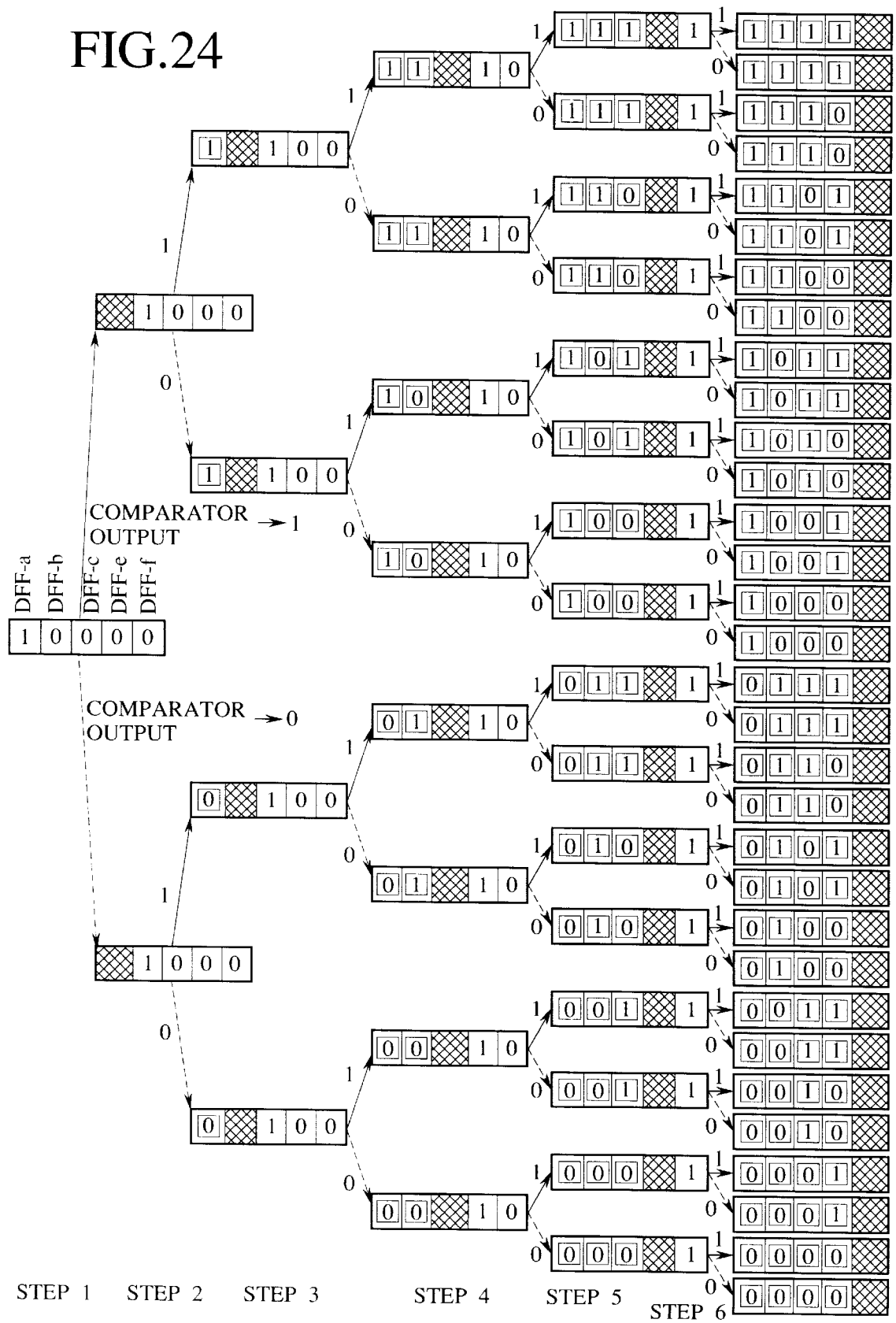
FIG. 24 is an explanatory diagram showing the updating algorithm of the register 85.

More specifically speaking, as illustrated in FIG. 24, each bit of the D-type flip-flops 85a to 85e is filled with the comparison result obtained by comparing the signal level of an analog signal as inputted with intermediate one of the reference voltage levels to be compared, from the most significant bit to the least significant bit. The intermediate contents of the D-type flip-flops 85a to 85e is output to and decoded by the decoder 82, which then output the control signal to the analog switches SW11111 to SW00001 for outputting the reference voltage level for next comparison.

The decoder 82 is composed of a conventional combinational logic circuit. FIG. 25(a) is a circuit diagram showing a 5 to 31 decoder which is suitable for use in the analog-digital converter in accordance with this embodiment.

Accordingly, in the case of the analog-digital converter in accordance with the this embodiment, the number of necessary steps for obtaining the final comparison result is reduced to the order of $\log_2(n)$, while in the case of the analog-digital converter in accordance with the first and second embodiments of the present invention, the number of necessary steps is of the order of n.

Next, a volume controller system in accordance with the present invention will be explained in the followings.

FIG. 26 is a block diagram showing the volume controller system provided with the analog-digital converter in accordance with the present invention as explained above and installed in a "Karaoke" sing-along system.

The "Karaoke" sing-along system is provided with an ASIC for the "Karaoke" sing-along system, which is connected to the microphones 10a and 10b, a loudspeaker 10d through an amplifier 10c, and the external control volume device 10e.

The ASIC for the "Karaoke" sing-along system IC 10 serves to control the signal level of voices as input from the microphones 10a and 10b and the level of the echo component thereof. This function is implemented by means of a three-channel analog-digital converter 11 designed in accordance with the present invention as described above.

The signal level of voices as input from the microphones 10a and 10b is amplified by microphone amplifiers 12 and 14 and controlled by the digital volume controllers 13 and 15. Furthermore, the level of the echo component generated by the digital delay circuit 17 is adjusted by the digital volume controller 18. The digital delay circuit 17 is composed of an analog-digital converter 17a, a delay circuit 17b and the digital-analog converter 17c.

The digital volume controllers 13, 15 and 18 are controlled by the conversion output signal of the analog-digital converter 11 as described above in accordance with the position of the external control volume device 10. The output signal of the digital volume controllers 13 and 15 are mixed with each other in a mixer 16 and input to the digital delay circuit 17. On the other hand, the output signal of the digital volume controller 18 is mixed in a mixer 19 with the output signal of the mixer 16. The output signal of the mixer 19 is fed back to the mixer 16 and is transferred to the amplifier 10c through a buffer amplifier in order to output vocal sounds from the loudspeaker 10d.

In accordance with the "Karaoke" sing-along system utilizing the analog-digital converter as described above, it is possible to eliminate the shortcoming that the output sound sometimes becomes deteriorated and discomfortable.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. An analog-digital converter comprising:

an analog conversion level generating circuit for generating a plurality of analog conversion levels corresponding to respective codes of digitized signals;

a comparator for comparing an analog signal as inputted with at least one of said analog conversion levels; and an analog-digital conversion code generating circuit for periodically outputting one of said digitized signals as an analog-digital conversion code corresponding to said analog signal as inputted, wherein adjacent analog conversion levels define ignoring regions and a non-ignoring regions, and the ignoring regions and the non-ignoring regions are provided alternately, and said analog-digital conversion code generating circuit outputs said analog-digital conversion code of a previous period when said analog signal as inputted is located within one of said ignoring regions.

2. The analog-digital converter as claimed in claim 1 wherein said analog-digital conversion code generating circuit comprises a 4-bit parallel-in-parallel-out register, a 4-bit parallel-in serial-out register, a 3-bit parallel-in-serial-out register, a D-type flip-flop, and a NOR gate.

3. The analog-digital converter as claimed in claim 2, wherein said analog-digital conversion code generating circuit is configured to output the analog-digital conversion code of the previous period when the signal level of the inputted analog signal is located adjacent to the analog conversion level corresponding to the analog-digital conversion code of the previous period, and to output the analog-digital conversion code corresponding to the analog conversion level adjacent to one of said ignoring regions in which the inputted analog signal is located when the signal level of the inputted analog signal is not located adjacent to the analog conversion level corresponding to the analog-digital conversion code of the previous period.

4. The analog-digital converter as claimed in claim 1 wherein said ignoring region has a width wider than said non-ignoring region.

5. A volume controller system comprising:
   a first volume controller for generating and outputting a first DC potential;
   the analog-digital converter as claimed in claim 1 designed for analog-digital converting said output signal of said first volume controller; and
   a second volume controller controlled by said conversion output signal of said analog-digital converter for generating and outputting a second DC potential.

6. The analog-digital converter as claimed in claim 1 wherein, in the case that the inputted analog signal is located within one of said ignoring regions, said analog-digital conversion code generating circuit is configured to output said analog-digital conversion code in said previous period when said inputted analog signal is located adjacent to said analog conversion level corresponding to said analog-digital conversion code in said previous period, and to output an analog-digital conversion code adjacent to said one of said ignoring regions when said analog signal is not located adjacent to said analog conversion level corresponding to said analog-digital conversion code in said previous period.

7. A method of converting an analog signal as inputted to a digitized signal corresponding to said analog signal comprising steps of:
   generating a plurality of analog conversion levels corresponding to respective codes of digitized signals;
   comparing said analog signal as inputted to at least one of said analog conversion levels; and
   periodically outputting one of said digitized signals as an analog-digital conversion code corresponding to said analog signal as inputted,
   wherein an ignoring region is provided between adjacent analog conversion levels and, said analog-digital conversion code of a previous period is output when said analog signal as inputted is located within said ignoring region.

8. The method of converting an analog signal to a digitized signal as claimed in claim 7 wherein comparison of said analog signal as inputted to at least one of said analog conversion levels is performed by a binary algorithm.

9. The method of converting an analog signal to a digitized signal as claimed in claim 8 wherein comparison of said analog signal as inputted to at least one of said analog conversion levels is performed by repeating the following steps:
   comparing said analog signal as inputted with intermediate one of the reference voltage levels to be compared; and
   narrowing the number of the reference voltage levels to be compared by excluding those of the reference voltage levels which are higher or lower than said intermediate one of the reference voltage levels.

10. The method of converting an analog signal to a digitized signal as claimed in claim 7 wherein said ignoring region has a width wider than half of difference between adjacent analog-digital conversion levels.

11. The method of converting an analog signal to a digitized signal as claimed in claim 7 wherein, in the case that said analog signal as inputted is located within one of said ignoring regions, said analog-digital conversion code in said previous period is output when said ignoring region is located adjacent to the analog conversion level corresponding to said analog-digital conversion code in said previous period while said another analog-digital conversion code corresponding to one of analog conversion levels adjacent to said ignoring region is output when said analog signal is not located adjacent to the analog conversion level corresponding to said analog-digital conversion code in said previous period.

12. An analog-digital converter comprising:
   a discrete potential generating circuit for generating a plurality of reference voltage levels;
   a control signal generating circuit connected to said discrete potential generating circuit for generating a control signal given to said discrete potential generating circuit in order to periodically output one of the reference voltage levels in turn;
   a comparator for comparing an analog signal as inputted with the reference voltage levels to output comparison result which determine a level of said analog signal as inputted respective to the reference voltage levels; and
   an output circuit for outputting an analog-digital conversion code of said analog signal in accordance with the comparison result of said comparator,
   wherein when the level of said analog signal as determined by said comparator corresponds to predetermined ones of the reference voltage levels, the analog-digital conversion code outputted from said output circuit is output again in a next period.

13. The analog-digital converter as claimed in claim 12 wherein comparison of said analog signal as inputted with the reference voltage levels is performed by a binary algorithm.

14. The analog-digital converter as claimed in claim 13 wherein comparison of said analog signal as inputted with the reference voltage levels is performed by repeating the following steps:
   comparing said analog signal as inputted with intermediate one of the reference voltage levels to be compared; and
   narrowing the number of the reference voltage levels to be compared by excluding those of the reference voltage levels which are higher or lower than said intermediate one of the reference voltage levels.

15. The analog-digital converter as claimed in claim 12 wherein said output circuit comprises a 4-bit parallel-inparallel-out register, a 4-bit parallel-in serial-out register, a 3-bit parallel-in-serial-out register, a D-type flip-flop, and a NOR gate.

16. The analog-digital converter as claimed in claim 15, wherein said analog-digital conversion code generating circuit is configured to output the analog-digital conversion code of the previous period when the signal level of the inputted analog signal is located adjacent to the analog conversion level corresponding to the analog-digital conversion code of the previous, and to output the analog-digital conversion code corresponding to the analog conversion level adjacent to one of said ignoring regions in which the inputted analog signal is located when the signal level of the inputted analog signal is not located adjacent to the analog conversion level corresponding to the analog-digital conversion code of the previous period.

17. The analog-digital converter as claimed in claim 12 wherein said region between the predetermined ones of the reference voltage levels has a width wider than half of a difference between adjacent other reference voltage levels.

18. The analog-digital converter as claimed in claim 12 wherein, in the case that said analog signal as inputted is located within said predetermined reference level region, said output circuit configured to output said analog-digital conversion code in said previous period when said predetermined reference voltage level region is located adjacent to the reference voltage level corresponding to said analog-digital conversion code in said previous period while said output circuit is configured to output another analog-digital conversion code corresponding to one of reference voltage levels adjacent to said predetermined reference voltage level region when said analog signal is not located adjacent to the reference voltage level corresponding to said analog-digital conversion code in said previous period.

19. The analog-digital converter as claimed in claim 12 wherein said control signal generating circuit comprises a 5-bit to 31-level decoder connected to said output circuit, a comparator connected to said output circuit, and a 5-bit register connected between said 5-bit to 31-level decoder and said comparator.

20. The analog-digital converter as claimed in claim 12 wherein said discrete potential generating circuit is constructed to generate reference voltage levels whose number corresponds to a number being double of the analog-digital conversion code.

21. The analog-digital converter as claimed in claim 12 wherein the predetermined ones of the reference voltage levels are alternately set in said plurality of reference voltage levels.

* * * * *